United States Patent
Fang et al.

(10) Patent No.: US 8,541,767 B2
(45) Date of Patent: Sep. 24, 2013

(54) MEMORY COMPONENT HAVING AN ELECTRICAL CONTACT FREE OF A METAL LAYER

(75) Inventors: Weiwei Lina Fang, Singapore (SG); Yee Chia Yeo, Singapore (SG); Rong Zhao, Singapore (SG); Luping Shi, Singapore (SG)

(73) Assignees: National University of Singapore, Singapore (SG); Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/093,149

(22) Filed: Apr. 25, 2011

(65) Prior Publication Data

US 2012/0267595 A1    Oct. 25, 2012

(51) Int. Cl.
*H01L 29/02* (2006.01)
(52) U.S. Cl.
USPC ...... 257/4; 257/2; 257/3; 257/5; 257/E29.002; 438/102; 438/103; 438/104; 365/163
(58) Field of Classification Search
USPC ................ 257/1–5, E29.002; 438/102–104; 365/163
See application file for complete search history.

(56) References Cited

U.S. PATENT DOCUMENTS

2005/0002227 A1* 1/2005 Hideki et al. ............... 365/163
2009/0189139 A1* 7/2009 Schrott et al. .................. 257/3

OTHER PUBLICATIONS

Fang, et al., Silicides as New Electrode/Heater for Compact Integration of Phase Change Memory with CMOS, 2010 International Symposium, VLSI Technology Systems and Applications, 138 (Apr. 2010).
Fang, et al., Phase Change Random Access Memory Devices with Nickel Silicide and Platinum Silicide Electrode Contacts for Integration with CMOS Technology, 158 Journal of the Electrochemical Society, H232 (2011).

* cited by examiner

*Primary Examiner* — Jami M Valentine
(74) *Attorney, Agent, or Firm* — K. David Crockett, Esq.; Niky Economy Syrengelas, Esq.; Crockett & Crockett, PC

(57) ABSTRACT

According to embodiments of the present invention, a memory component is provided. The memory component includes a storage component comprising a resistance changing material; and an electrical contact coupled to the storage component, wherein the electrical contact comprises silicide, wherein the memory component is free of a metal layer between the storage component and the electrical contact, and wherein the electrical contact is free of a metal layer.

8 Claims, 30 Drawing Sheets

MEMORY COMPONENT HAVING AN ELECTRICAL CONTACT FREE OF A METAL LAYER

TECHNICAL FIELD

Various embodiments relate to a memory component and a memory cell.

BACKGROUND

Non-volatile memory technology is driven by the increasing demand for memory in consumer electronics. Currently, FLASH memory is the mainstream technology used but it is reaching its physical limitations, and major scaling challenges are faced below the 16 nm technology node. Various alternative non-volatile memory technologies have been proposed to replace FLASH, including the Ferroelectric Random Access Memory (FeRAM), Magnetic Random Access Memory (MRAM), and the Phase Change Random Access Memory (PCRAM). PCRAM exhibits fast read and write speeds, low power consumption, non-destructive read, and long cycle endurance characteristics. The high scalability of PCRAM technology makes it attractive over the other contenders.

Current phase change random access memory (PCRAM) cell design features a combination of an access device (or a selection device) and a phase change memory component. The selection device includes a bipolar junction transistor (BJT), a metal oxide semiconductor field effect transistor (MOSFET), or a diode.

Various integration studies of PCRAM with complementary-metal-oxide-semiconductor (CMOS) technology have been performed, employing a MOS transistor (e.g. a metal oxide semiconductor field effect transistor (MOSFET)), bipolar junction transistor (BJT) or diode as the access device. In these studies, an intermediate metal material or metal layer is required as the bottom contact such as a tungsten (W) plug.

FIG. 1 shows a schematic diagram of a phase change memory cell 100 of prior art. The phase change memory cell 100 has a 1T-1R cell structure, including an access device 102 and a memory component 104 in contact with the access device 102 via a tungsten (W) plug 118. A 1T-1R cell structure refers to a structure having one access transistor (1T) (e.g. the access device 102) and one resistor (1R) in the form of a phase change material (e.g. in the memory component 104).

The access device 102 is a MOSFET having a source (S) 106a, a drain (D) 108a and a gate (G) 110. The access device 102 further includes a source terminal 106b coupled to the source 106a, and a drain terminal 108b coupled to the drain 108a. The access device 102 is formed on a silicon substrate 112.

The memory component 104 includes a phase change memory component 114 and a top electrode 116. As shown in FIG. 1, the access device 102 and the phase change memory component 114 are linked up via a tungsten plug 118, which acts as a bottom electrode for the memory component 104 and also a heater to the phase change material of the phase change memory component 114.

In a phase change memory device, the phase change material switches between a crystalline phase and an amorphous phase for binary storage during the SET and RESET operation, respectively. An electric pulse is applied for generation of Joule heat to alternate the material between these two phases. During the SET process, the amorphous phase change material is heated above its crystallization temperature for a sufficiently long time to convert it to the crystalline phase. On the other hand, during the RESET process, switching from the crystalline to amorphous phase is accomplished by raising the temperature above the melting point followed by rapid quenching. The higher temperature needed for the RESET operation requires an electrical pulse of larger amplitude. However, the high current required in the RESET process to amorphize the phase change material limits the size of the access device providing the current. Therefore, the current required during the RESET process should be minimized to realize cost-effective and high-density PCRAM, since it imposes a requirement on the size of the access device providing the current.

For cost-effective and high density memory devices, various techniques have been employed to reduce the RESET current, such as by improving the structural design of the phase change memory component and device, engineering of the phase change material and manipulation of the properties of the heater or contact material. A metal contact with a material with suitable thermal properties and good contact is preferred for improved device performances.

SUMMARY

According to an embodiment, a memory component is provided. The memory component may include a storage component comprising a resistance changing material; and an electrical contact coupled to the storage component, wherein the electrical contact comprises silicide, and wherein the memory component is free of a metal layer between the storage component and the electrical contact, and wherein the electrical contact is free of a metal layer.

According to an embodiment, a memory cell is provided. The memory cell may include a storage component comprising a resistance changing material; and an access device comprising a terminal, wherein the terminal is configured to function as an electrical contact of the storage component for electrical communication between the access device and the storage component, and wherein the memory cell is free of a metal layer between the storage component and the terminal and wherein the terminal is free of a metal layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various embodiments provide non-volatile memory devices, including non-volatile memory components and memory cells, for example resistance storage based memory devices, such as phase change random access memory devices, without or with reduced at least some of the associated disadvantages of conventional devices.

Various embodiments may provide a memory component and a memory cell (e.g. a phase change memory component and cell) with a silicide contact. The memory component and cell may include one or more dielectric layers or interlayers. In addition, various embodiments may provide memory devices, for example including one or more (e.g. an array) of memory components and memory cells of various embodiments.

Figure 1:
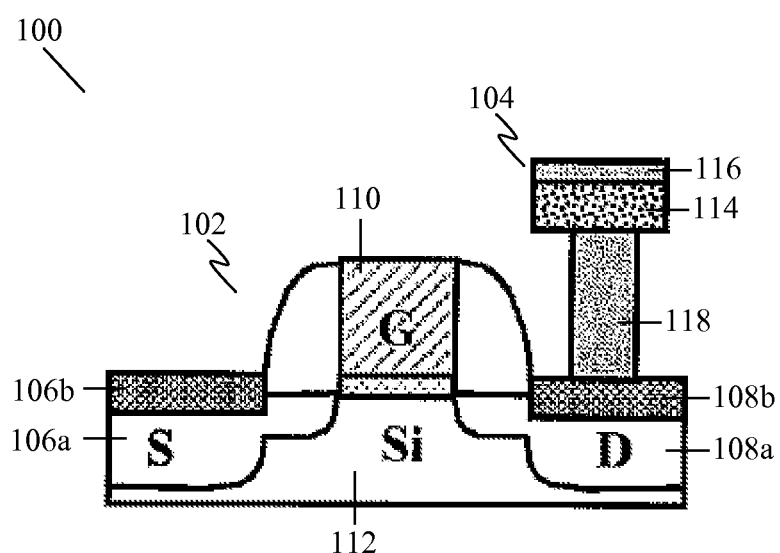
FIG. 1 shows a schematic diagram of a phase change memory cell of prior art.

Various embodiments may provide a memory cell (e.g. a PCRAM cell) which may facilitate the integration of a memory component directly on an access device, such as a MOSFET. The drain region of the MOSFET may be silicided, for example having a drain terminal containing silicide or metal silicide, which may be used as a bottom electrode for the memory component. In addition, the silicided bottom electrode functions as a heater to provide thermal energy to the memory component, for example to the resistance changing material, such as a phase change material, of the memory component. A more compact structure with a reduced number of processing steps may be achieved by the immediate contact of the memory component (e.g. a phase change memory component) onto the access device as the processing steps relating to the formation of a tungsten electrode, as in the prior art (e.g. tungsten plug 118 of FIG. 1), is not required. Furthermore, silicides may reduce the source and/or drain resistances in a transistor, e.g. a MOSFET.

According to various embodiments, silicides may possess a higher electrical resistivity and a lower thermal conductivity than metals such as tungsten (W), and therefore employing silicides as the bottom electrode as well as a heater may improve the heating efficiency in a memory component or memory cell. In various embodiments, a combination of high electrical resistivity and low thermal conductivity may provide or facilitate good or improved heating efficiency. A higher electrical resistivity provides a greater heating effect. Based on the equation $P=I^2R$, where P is power, I is current and R is resistance, a higher resistivity results in a higher resistance and therefore a higher power, thereby providing greater heating, for example to the phase change material of the memory component or memory cell. In addition, a material having a lower thermal conductivity may be able to minimize or suppress heat diffusion away from, for example the phase change material of the memory component or memory cell, thereby improving the heating efficiency. In addition, silicides provide better contacts, thereby enabling a higher current flow between the silicides and the phase change material. This is because a reduced hole barrier is formed at the interface between the silicide and the phase change material, as compared to the barrier formed at the interface between a metal and a phase change material. The reduced hole barrier allows current to flow across the silicide/phase change material interface more easily, thereby enabling a higher current flow.

In addition, various embodiments may provide or integrate one or more dielectric layers in the memory component to provide thermal confinement effects, which may facilitate raising the temperature profile in the phase change material during switching between different resistance or resistivity states or phases. This may enable lower operating power.

Various embodiments may provide a memory cell (e.g. a phase change random access memory or PCRAM), including a memory component and an access device or a selection device. In various embodiments, the terms "access device" and "selection device" refer respectively to a device (e.g. a transistor) which accesses or selects the memory component coupled to the access device or selection device. The access device or the selection device may provide a current or a voltage or may control the application of a current or a voltage to the memory component coupled to the access device or selection device. In various embodiments, the access device may be a bipolar junction transistor (BJT), a field effect transistor (FET) such as a metal oxide semiconductor field effect transistor (MOSFET), a metal-semiconductor field effect transistor (MESFET), or a metal-insulator field effect transistor (MISFET) or a diode. In various embodiments, a bottom contact of the memory component may include a silicide material or is made of a silicide material. In embodiments where the access device is a MOSFET, the bottom contact of the memory component may be the silicided drain terminal of the MOSFET, where the resistance changing material, such as a phase change material, may be disposed or integrated on the silicided drain of the MOSFET. However, it should be appreciated that the bottom contact of the memory component may also be the silicided source terminal of the MOSFET. In addition, in various embodiments, one or more thin dielectric layers (having a thickness of a few nm) may be disposed or inserted between the phase change material and the silicide material, or disposed within the phase change material or disposed over the phase change material.

In various embodiments, the silicide contact may be in direct contact with the phase change material, where the silicide contact may function as a contact material (e.g. as an electrode) for the phase change material, as well as a heater for the phase change material. When an electrical pulse (e.g. a current pulse) is applied to the silicide contact, the electric current causes joule heating within the phase change material. Depending on the magnitude and length of the electrical pulse, the phase change material reversibly switches or alternates between an amorphous phase and a crystalline phase. As the different phases or states are stable, the memory component and the memory cell of various embodiments may provide non-volatile memory storage. Therefore, various embodiments may provide the use of an unconventional material (i.e. silicide) as an electrode or contact material, and enable the integration of a PCRAM in the front-end processes.

In various embodiments, the substrate material where an access device (e.g. a MOSFET) is provided may be a group IV semiconductor such as silicon (Si), germanium (Ge) or a compound of $Si_xGe_y$. In addition, the substrate material may be a III-V semiconductor, including a group III element such as aluminum (Al), gallium (Ga) or indium (In), and a group V element such as nitrogen (N), arsenic (As) or antimony (Sb). In embodiments where the substrate is silicon-based, a metal may be deposited and a silicidation process carried out to form a metal silicide contact, for example as a bottom electrode of a memory component. In embodiments where the substrate is not silicon-based, a metal may be deposited and after a reaction of the metal and the substrate material and after annealing at the source or drain region, the resulting reaction product may be used as the contact.

Various embodiments may provide a memory component. The memory component may include a storage component including a resistance changing material, and an electrical contact coupled to the storage component, where the electrical contact includes silicide. The storage component may be directly connected or coupled to the electrical contact (e.g. the storage component may be directly in contact with the electrical contact), or the storage component may be coupled to the electrical contact, with a dielectric layer (e.g. $SiO_2$, SiNx, ZrOx) disposed in between.

Various embodiments may provide a method of forming a memory component. The method may include forming an electrical contact, the electrical contact including silicide. The method may include depositing a storage component over the electrical contact, the storage component including a resistance changing material. In various embodiments, the storage component may be deposited directly on the electrical contact (e.g. the storage component may be directly in contact with the electrical contact), or the storage component may be deposited on the electrical contact, with a dielectric layer (e.g. $SiO_2$, SiNx, ZrOx) disposed in between.

In various embodiments, forming the electrical contact may include depositing a metal on a silicon substrate. The metal may be selected from a group consisting of a transition metal element, a group II element, a group III element and any combinations thereof. Silicidation is then performed, for example using a rapid-thermal annealing (RTA) process, a laser annealing process or a furnace annealing process, to form metal silicides. Subsequently, any unreacted metal may be removed, for example using a selective wet etch process.

Various embodiments may provide a memory cell. The memory cell includes a storage component including a resistance changing material, an access device including a terminal, wherein the terminal is configured to function as an electrical contact of the storage component for electrical communication between the access device and the storage component. In various embodiments, the storage component may be directly connected or coupled to the terminal (e.g. the storage component may be directly in contact with the terminal), or the storage component may be coupled to the terminal, with a dielectric layer (e.g. $SiO_2$, SiNx, ZrOx) disposed in between.

Various embodiments may provide a method of forming a memory cell. The method may include forming an access device. The method may further include forming a terminal on the access device. The method may further include depositing a storage component over the terminal. In various embodiments, the storage component includes a resistance changing material. In various embodiments, the terminal is configured to function as an electrical contact of the storage component for electrical communication between the access device and the storage component.

In various embodiments, the storage component may be deposited directly on the terminal (e.g. the storage component may be directly in contact with the terminal), or the storage component may be deposited on the terminal, with a dielectric layer (e.g. $SiO_2$, SiNx, ZrOx) disposed in between.

In order that the invention may be readily understood and put into practical effect, particular embodiments will now be described by way of examples and not limitations, and with reference to the figures.

Figure 2A:
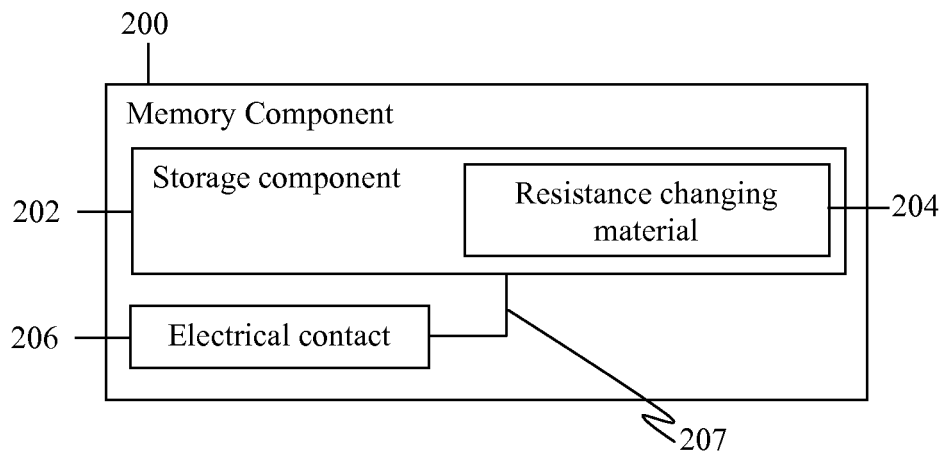
FIG. 2A shows a schematic block diagram of a memory component, according to various embodiments.

FIG. 2A shows a schematic block diagram of a memory component 200, according to various embodiments. The memory component 200 includes a storage component 202 including a resistance changing material 204, and an electrical contact 206 coupled to the storage component 202, where the electrical contact 206 includes silicide. The memory component 200 is free of a metal layer between the storage component 202 and the electrical contact 206, and the electrical contact 206 is free of a metal layer. The metal layer may be of any metals, including transition metals. In other words, the memory component 200 may be free of a metal layer (i.e. a metal layer is not present), for example the memory component 200 may be free of or may not include an aluminum layer, a tungsten layer or a titanium-tungsten layer, between the storage component 202 and the electrical contact 206. In addition, the electrical contact 206 may be free of a metal layer (i.e. a metal layer is not present), for example the electrical contact 206 may be free of or may not include an aluminum layer, a tungsten layer or a titanium-tungsten layer. In various embodiments, the storage component 202 may be directly connected or coupled to the electrical contact 206 (e.g. the storage component 202 may be directly in contact with the electrical contact 206), or the storage component 202 may be coupled to the electrical contact 206, with a dielectric layer (e.g. $SiO_2$) disposed in between.

In FIG. 2A, the line represented as 207 is illustrated to show the relationship between the different components, which may include electrical coupling and/or mechanical coupling.

In the context of various embodiments, the memory component 200 may be a phase change memory component, for example a PCRAM.

In various embodiments, the electrical contact 206 may be an electrode (e.g. a bottom electrode) for the storage component 202. The electrical contact 206 may be electrically coupled to the storage component 202. In addition, in various embodiments, the electrical contact 204 may be mechanically coupled to the storage component 202.

Figure 2B:
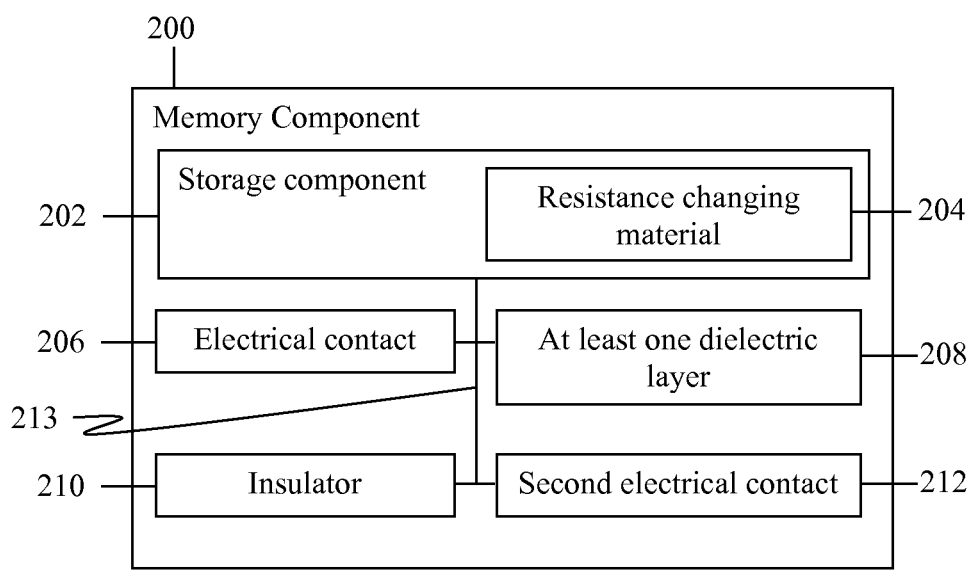
FIG. 2B shows a schematic block diagram of a memory component, according to various embodiments.

FIG. 2B shows a schematic block diagram of a memory component, according to various embodiments. The memory component 200 may include a storage component 202 including a resistance changing material 204, and an electrical contact 206 coupled to the storage component, similar to the embodiment of FIG. 2A. The memory component 200 may further include at least one dielectric layer 208 in contact with the storage component 202. In various embodiments, the at least one dielectric layer 208 may be disposed on at least one side of the storage component 202 and/or disposed within the storage component 202.

The memory component 200 may further include an insulator 210 configured to partially surround the storage component 202. The insulator 210 may be a thermal insulator (i.e. thermally insulating such that heat may not substantially conduct in the insulator 210) and/or an electrical insulator (i.e. electrically insulating such that electrical charges may not substantially conduct in the insulator 210).

The memory component 200 may further include a second electrical contact 212 coupled to the storage component 202, wherein the second electrical contact 212 is arranged on a side of the storage component 202 opposite the electrical contact 206. In various embodiments, the second electrical contact 212 may be an electrode (e.g. a top electrode) for the storage component 202. The second electrical contact 212 may be electrically coupled to the storage component 202. In addition, in various embodiments, the second electrical contact 212 may be mechanically coupled to the storage component 202. In various embodiments, the second electrical contact 212 may include a metal which may provide good contact with the resistance changing material 204.

In FIG. 2B, the line represented as 213 is illustrated to show the relationship between the different components, which may include electrical coupling and/or mechanical coupling.

In various embodiments, the second electrical contact 212 may include but is not limited to tungsten (W), titanium-tungsten (TiW), titanium-nitride (TiN) or tantalum-nitride (TaN).

Figure 2C:
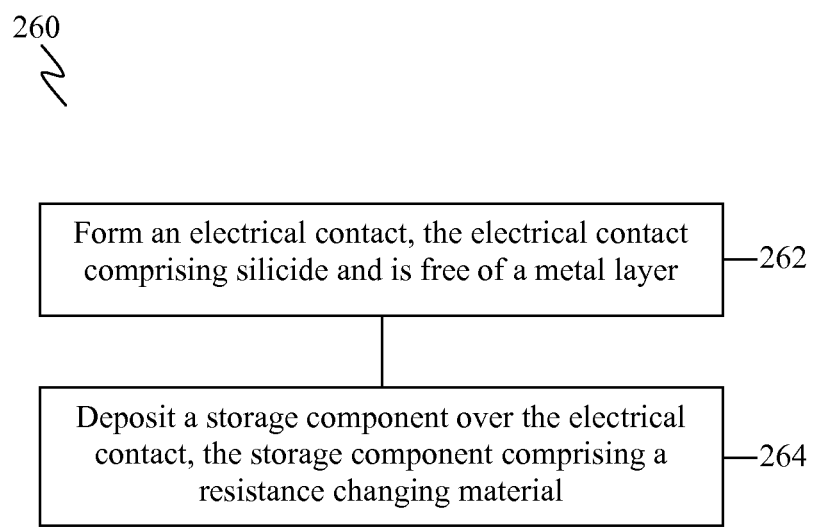
FIG. 2C shows a flow chart illustrating a method of forming a memory component, according to various embodiments.

FIG. 2C shows a flow chart 260 illustrating a method of forming a memory component, according to various embodiments.

At 262, an electrical contact is formed, the electrical contact including silicide and is free of a metal layer. In various embodiments, forming the electrical contact may include depositing metal on a silicon substrate. The metal may be selected from a group consisting of a transition metal element, a group II element, a group III element and any combinations thereof. Silicidation is then performed, for example using a rapid-thermal annealing (RTA) process, to form metal silicides. Subsequently, any unreacted metal may be removed, for example using a selective wet etch process.

At 264, a storage component is deposited over the electrical contact, the storage component including a resistance changing material.

In various embodiments, the method is free of forming a metal layer between the storage component and the electrical contact.

In the context of various embodiments, terms such as "memory element", "memory member", "memory module" and/or "memory arrangement", may be used interchangeably for the term "memory component".

Figure 2D:
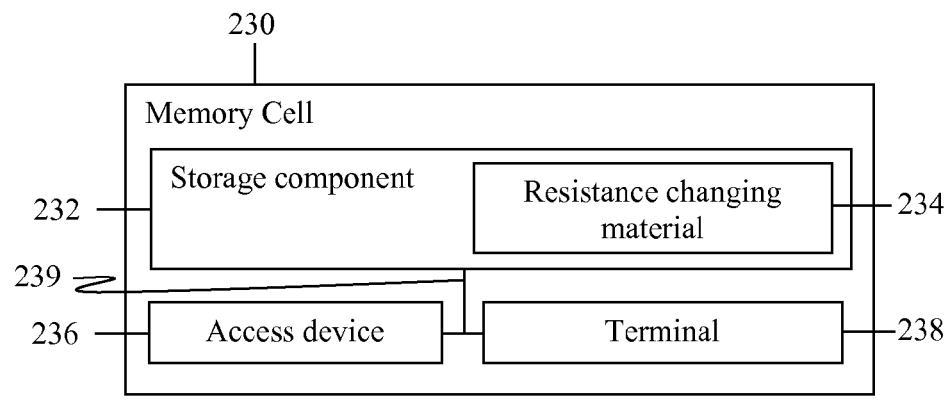
FIG. 2D shows a schematic block diagram of a memory cell, according to various embodiments.

FIG. 2D shows a schematic block diagram of a memory cell 230, according to various embodiments. The memory cell 230 includes a storage component 232 including a resistance changing material 234, an access device 236 including a terminal 238, wherein the terminal 238 is configured to function as an electrical contact of the storage component 232 for electrical communication between the access device 236 and the storage component 232, and wherein the memory cell 230 is free of a metal layer between the storage component 232 and the terminal 238, and wherein the terminal 238 is free of a metal layer. The metal layer may be of any metals, including transition metals. In other words, the memory cell 230 may be free of a metal layer (i.e. a metal layer is not present), for example the memory cell 230 may be free of or may not include an aluminum layer, a tungsten layer or a titanium-tungsten layer, between the storage component 232 and the terminal 238. In addition, the terminal 238 may be free of a metal layer (i.e. a metal layer is not present), for example the terminal 238 may be free of or may not include an aluminum layer, a tungsten layer or a titanium-tungsten layer. In various embodiments, the storage component 232 may be directly connected or coupled to the terminal 238 (e.g. the storage component 232 may be directly in contact with the terminal 238), or the storage component 232 may be coupled to the terminal 238, with a dielectric layer (e.g. $SiO_2$) disposed in between.

In various embodiments, the storage component 232 may be disposed on the terminal 238. In various embodiments, the storage component 232 may be directly disposed on the terminal 238.

In various embodiments, the terminal 238 may function as an electrode (e.g. a bottom electrode) for the storage component 232. The terminal 238 may be electrically coupled to the storage component 232. In addition, in various embodiments, the terminal 238 may be mechanically coupled to the storage component 232.

In FIG. 2D, the line represented as 239 is illustrated to show the relationship between the different components, which may include electrical coupling and/or mechanical coupling.

In the context of various embodiments, the memory cell 230 may be a phase change memory cell, for example a PCRAM cell.

Figure 2E:
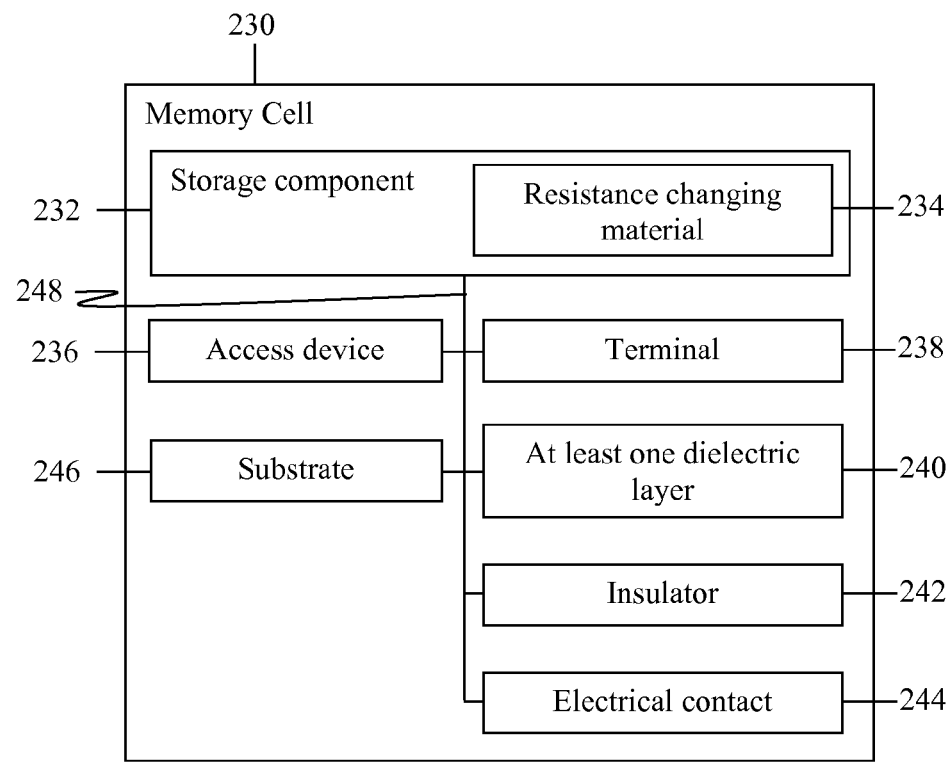
FIG. 2E shows a schematic block diagram of a memory cell, according to various embodiments.

FIG. 2E shows a schematic block diagram of a memory cell, according to various embodiments. The memory cell 230 may include a storage component 232 including a resistance changing material 234, and an access device 236 including a terminal 238, similar to the embodiment of FIG. 2D. The memory cell 230 may further include at least one dielectric layer 240 in contact with the storage component 232. In various embodiments, the at least one dielectric layer 240 may be disposed on at least one side of the storage component 232 and/or disposed within the storage component 232.

The memory cell 230 may further include an insulator 242 configured to partially surround the storage component 232. The insulator 242 may be a thermal insulator (i.e. thermally insulating such that heat may not substantially conduct in the insulator 242) and/or an electrical insulator (i.e. electrically insulating such that electrical charges may not substantially conduct in the insulator 242).

The memory cell 230 may further include an electrical contact 244 coupled to the storage component 232, wherein the electrical contact 244 is arranged on a side of the storage component 232 opposite the terminal 238. In various embodiments, the electrical contact 244 may be an electrode (e.g. a top electrode) for the storage component 202. The electrical contact 244 may be electrically coupled to the storage component 232. In addition, in various embodiments, the electrical contact 244 may be mechanically coupled to the storage component 232. In various embodiments, the electrical contact 244 may include a metal which may provide good contact with the resistance changing material 234.

In FIG. 2E, the line represented as 248 is illustrated to show the relationship between the different components, which may include electrical coupling and/or mechanical coupling.

In various embodiments, the electrical contact 244 may include but is not limited to tungsten (W), titanium-tungsten (TiW), titanium-nitride (TiN) or tantalum-nitride (TaN).

In various embodiments, the access device 236 may include a substrate 246. The substrate 246 may have a substrate material selected from a group IV semiconductor or a combination of a group III semiconductor and a group V semiconductor.

In various embodiments, the substrate material of the substrate 246 may include silicon, silicon-on-insulator, germanium, or a silicon and germanium compound, or may include a combination of one of aluminum, gallium or indium, and one of nitrogen, arsenic or antimony.

In the context of various embodiments, the terminal 238 may include a compound of the substrate material of the substrate 246. As an example and not limitations, a metal may be deposited on the substrate, for example on a portion of the substrate, and a reaction process performed to react the metal with the substrate material, in order to form a compound of the substrate material including the metal. In other words, the reaction process produces a metal compound of the substrate material.

In the context of various embodiments, the terminal 238 may include silicide. In embodiments where the substrate is silicon-based, a metal may be deposited and a silicidation process, for example via a rapid-thermal annealing (RTA) process, is carried out to form the terminal 238 including silicide.

In the context of various embodiments, the terminal 238 may include a metal. In embodiments where the substrate is not silicon-based, a metal may be deposited and after a reaction of the metal and the substrate material and after annealing, for example at a source or drain region, the resulting reaction product may be used to form the terminal 238.

In the context of various embodiments, the access device 236 may include a field effect transistor (FET), a bipolar junction transistor (BJT) or a diode. The FET may be a metal oxide semiconductor field effect transistor (MOSFET) or a metal-insulator field effect transistor (MISFET), or a metal-semiconductor field effect transistor (MESFET).

In embodiments where the access device 236 may include a FET, the terminal 238 may be a drain terminal or a source terminal.

In embodiments where the access device 236 may include a FET, the FET may include a conduction channel between the drain terminal and the source terminal. In various embodiments, the conduction channel may include a fin structure or a nanowire. In various embodiments, the conduction channel may include silicon (Si), germanium (Ge), or a compound semicondctor (e.g. III-V semiconductor).

Figure 2F:
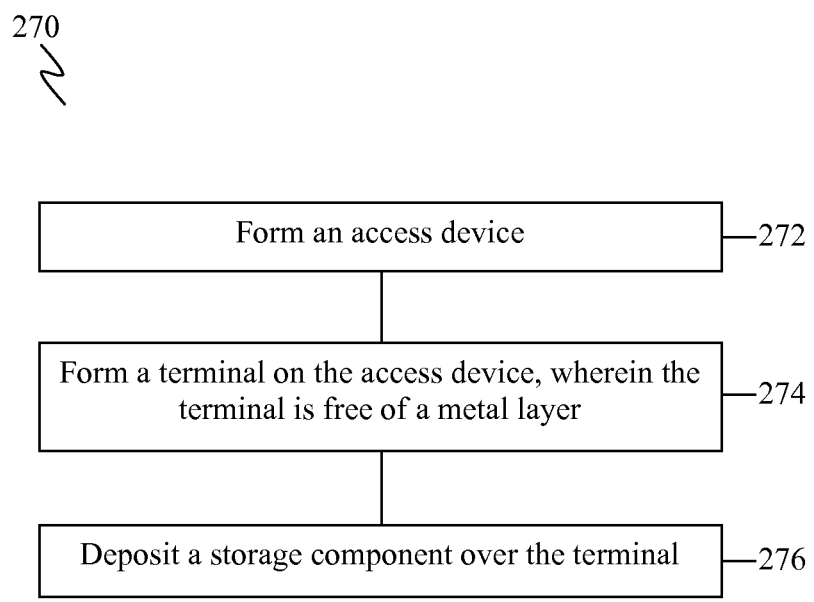
FIG. 2F shows a flow chart illustrating a method of forming a memory cell, according to various embodiments.

FIG. 2F shows a flow chart 270 illustrating a method of forming a memory cell, according to various embodiments.

At 272, an access device is formed.

At 274, a terminal is formed on the access device, where the terminal is free of a metal layer.

At 276, a storage component is deposited over the terminal. In various embodiments, the storage component includes a resistance changing material. In various embodiments, the terminal is configured to function as an electrical contact of the storage component for electrical communication between the access device and the storage component.

In various embodiments, the method is free of forming a metal layer between the storage component and the terminal.

In the context of various embodiments, each of the at least one dielectric layer may include but is not limited to a binary oxide compound ($A_xO_y$), a binary nitride compound ($A_xN_y$) or a perovskite oxide ($ABO_x$), where A and B may be a transition metal element, including an element of the Lanthanide series.

In the context of various embodiments, each of the at least one dielectric layer may include but is not limited to a material selected from a group consisting of hafnium oxide ($HfO_2$), silicon nitride ($Si_3N_4$), aluminum oxide ($Al_2O_3$), strontium titanate ($SrTiO_3$), lead titanate ($PbTiO_3$), barium zirconate ($BaZrO_3$), lead zirconate ($PbZrO_3$), tantalum pentoxide ($Ta_2O_5$), strontium bismuth tantalate ($SrBi_2Ta_2O_9$), titanium oxide ($TiO_2$), zirconium oxide ($ZrO_2$), yttrium oxide ($Y_2O_3$), lanthanum oxide ($La_2O_3$), zirconium silicate ($ZrSiO_4$), hafnium silicate ($HfSiO_4$) and samarium oxide ($Sm_2O_3$). However, it should be appreciated that each of the at least one dielectric layer may be any dielectric material with good thermal confinement properties (e.g. with low thermal conductivity values).

In the context of various embodiments, the insulator may include but is not limited to a binary oxide compound ($A_xO_y$), a binary nitride compound ($A_xN_y$) or a perovskite oxide ($ABO_x$), where A and B may be a transition metal element, including an element of the Lanthanide series.

In the context of various embodiments, the insulator may include but is not limited to a material selected from a group consisting of silicon dioxide ($SiO_2$), hafnium oxide ($HfO_2$), silicon nitride ($Si_3N_4$), aluminum oxide ($Al_2O_3$), strontium titanate ($SrTiO_3$), lead titanate ($PbTiO_3$), barium zirconate ($BaZrO_3$), lead zirconate ($PbZrO_3$), tantalum pentoxide ($Ta_2O_5$), strontium bismuth tantalate ($SrBi_2Ta_2O_9$), titanium oxide ($TiO_2$), zirconium oxide ($ZrO_2$), yttrium oxide ($Y_2O_3$), lanthanum oxide ($La_2O_3$), zirconium silicate ($ZrSiO_4$), hafnium silicate ($HfSiO_4$) and samarium oxide ($Sm_2O_3$). However, it should be appreciated that the insulator may be any dielectric or insulating material with good thermal confinement properties (e.g. with low thermal conductivity values).

In the context of various embodiments, the resistance changing material may be a resistivity changing material, for example including a phase change material or may be a phase change material. The phase change material may be configured to change from an amorphous phase to a crystalline phase and/or may be configured to change from a crystalline phase to an amorphous phase. Accordingly, the memory component and/or the memory cell of various embodiments may include a resistivity changing material or a phase change material, for example in the storage component.

In the context of various embodiments, the resistivity changing material may change its resistance as a result of a change in its resistivity.

In the context of various embodiments, the phase change material may include a chalcogenide or an alloy of chalcogenides. The phase change material may include one of tellurium, selenium, sulphur or any combinations thereof.

In the context of various embodiments, the phase change material may include but is not limited to a material selected from a group consisting of germanium-tellurium (GeTe), antimony-tellurium (SbTe), silver-indium (AgIn), germanium-antimony-tellurium (GeSbTe), silver-indium-antimony-tellurium (AgInSbTe), tellurium-arsenic-germanium (TeAsGe), tellurium-selenium-sulphur (TeSeS), tellurium-selenium-antimony (TeSeSb), indium-antimony-tellurium (InSbTe) and tellurium-germanium-tin (TeGeSn).

In various embodiments, the phase change material may include a dopant. It should be appreciated that one or more types of dopant elements may be provided in the phase change material. In various embodiments, the dopant may be selected from a group consisting of germanium (Ge), tellurium (Te), antimony (Sb), silver (Ag), indium (In), chromium (Cr), nitrogen (N), selenium (Se), tin (Sn), silicon (Si), bismuth (Bi) and any combinations thereof. However, it should be appreciated that other dopants may be used.

In the context of various embodiments, the silicide may include a metal selected from a group consisting of a transition metal element, a group II element, a group III element and any combinations thereof, for forming a metal silicide. The metal silicide may be formed by silicidation, for example silicidation of the metal and the silicon material of the substrate via, for example, a rapid-thermal annealing (RTA) process, a laser annealing process, or a furnace annealing process. The processes may be performed at about 300° C. to about 700° C.

In various embodiments, the transition metal element for forming the silicide may include at least one of scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg) or any combinations thereof.

In various embodiments, the group II element or metal for forming the silicide may include but is not limited to at least one of magnesium (Mg), calcium (Ca), strontium (Sr), barium (Ba) or any combinations thereof.

In various embodiments, the group III element or metal for forming the silicide may include but is not limited to at least one of aluminum (Al), gallium (Ga), indium (In) or any combinations thereof.

In the context of various embodiments, the silicide may include various phases, such as a phase having a composition of $M_xSi_y$, where M is a metal. Furthermore, M may also be a transition metal. As an example and not limitations, various phases that may be formed include MSi, $MSi_2$, $M_2Si$, $MSi_3$, or $M_2Si_2$, where each phase may have a different crystal structure.

In the context of various embodiments, the silicide may be a silicide layer having a thickness of about 10 nm to about 30 nm. The thickness of the silicide layer may vary depending on the technology node and the feature size of the access device or selection device.

Figure 3:
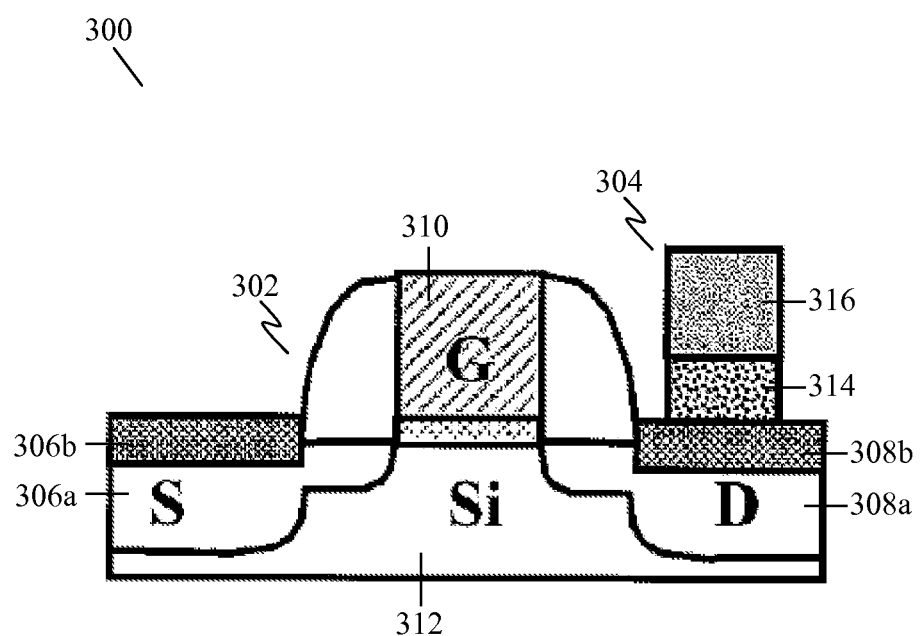
FIG. 3 shows a schematic diagram of a phase change memory cell, according to various embodiments.

FIG. 3 shows a schematic diagram of a phase change memory cell 300, according to various embodiments. The phase change memory cell 300 includes an access device 302 and a memory component 304 that is disposed directly in contact with the access device 302.

The access device 302 is a MOSFET having a source (S) 306*a*, a drain (D) 308*a* and a gate (G) 310. The access device 302 further includes a source terminal 306*b* coupled to the source 306*a*, and a drain terminal 308*b* coupled to the drain 308*a*. The access device 302 is formed on a silicon substrate 312. The source terminal 306*b* and/or the drain terminal 308*b* include silicide.

The memory component 304 includes a storage component (e.g. a phase change memory component) 314 and a top electrode or contact 316. The storage component 314 may include, for example germanium-antimony-tellurium (e.g. $Ge_2Sb_2Te_5$) while the top electrode 316 may include a tungsten-based metal. As shown in FIG. 3, the storage component 314 is in contact with a bottom electrode or contact (e.g. the drain terminal 308*b* including a silicide material), and the top electrode 316, such that there is no metal layer (e.g. of any metals, including transition metals) between the storage component 314 and the drain terminal 308*b*. Accordingly, the memory cell 300 is free of a metal layer, such as the tungsten plug 118 of FIG. 1, between the storage component 232 and the terminal 238, and that the drain terminal 308*b* is free of a metal layer, such as the tungsten plug 118 of FIG. 1.

The phase change memory cell 300 offers a more compact 1T-1R cell structure, as the memory component 304 is disposed on the silicided drain terminal 308*b* of the access device 302, where the silicided drain acts as a contact (e.g. a bottom electrode) of the storage component 314 and the memory component 304.

While FIG. 3 shows a bulk planar MOSFET as the access device 302, the access device may have other structures or configurations such as multiple-gated FETs, FINFETs or Nanowire FETs. A FINFET is a FET device where the conducting channel is a thin, finlike wall protruding out of the substrate and is partially surrounded by a gate dielectric/gate, while a nanowire FET is a FET device where the conducting channel is a nanowire, which is at least substantially completely surrounded by a gate dielectric/gate. In various embodiments, the gate dielectric is deposited to surround the conducting channel prior to the deposition of the gate over the gate dielectric, such that both the gate and the gate dielectric are deposited to partially surround the conducting channel (for example for FINFETs) or at least substantially completely surround the conducting channel (for example for nanowire FETs).

Figure 4A:
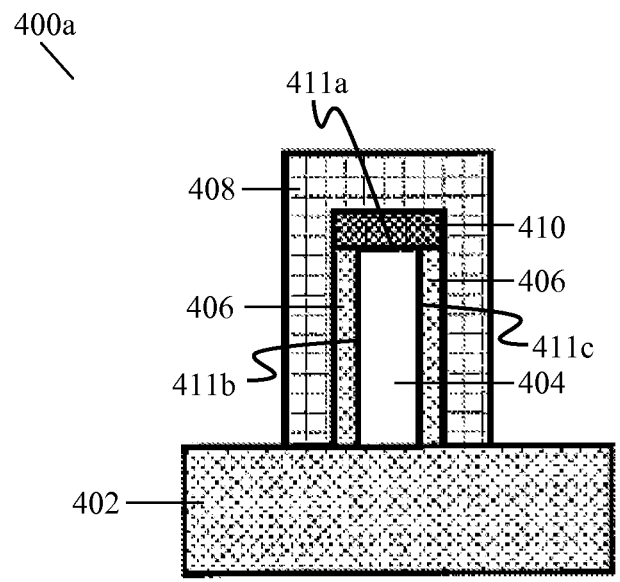
FIGS. 4A to 4C show schematic cross-sectional views of a field effect transistor (FET) based on a silicon-on-insulator (SOI) substrate, according to various embodiments.
Figure 4B:
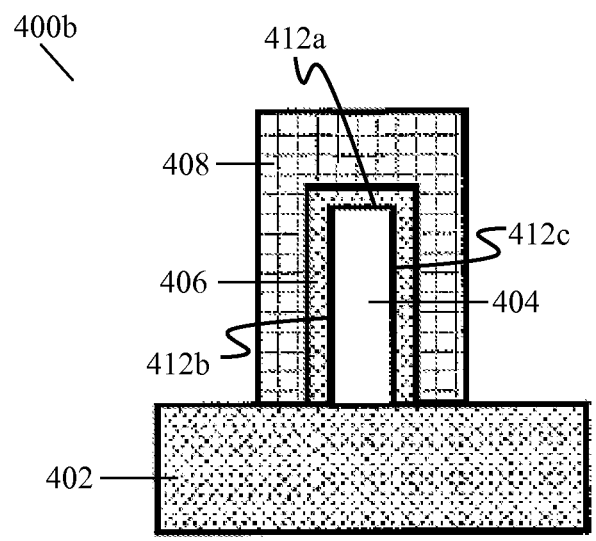
Figure 4C:
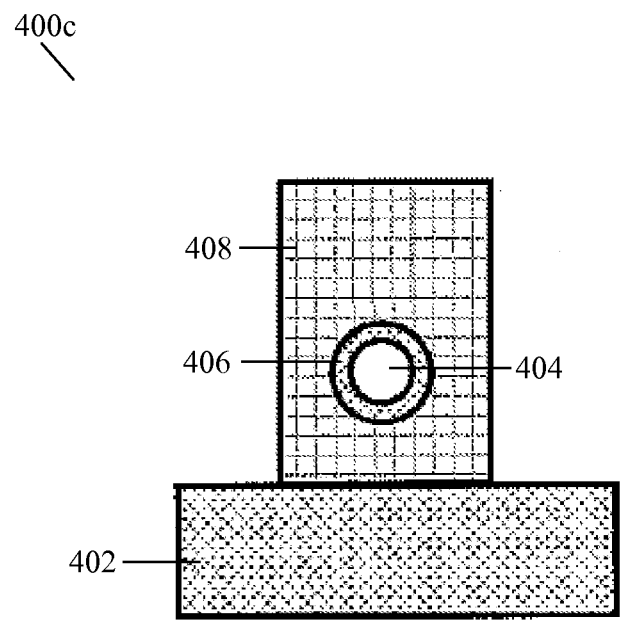

FIGS. 4A to 4C show schematic cross-sectional views of a FET 400a, 400b, 400c, respectively, based on an SOI substrate 402, according to various embodiments. The SOI substrate includes a buried oxide (BOX). Each of the FET 400a, 400b, 400c, respectively, of the embodiments of FIGS. 4A to 4C may be a FINFET or a nanowire FET.

The respective FET 400a, 400b, 400c, includes a conduction channel 404, which may be a silicon (Si), a germanium (Ge), or a compound semicondctor (e.g. III-V semiconductor) conduction channel. In addition, the conduction channel may be a strained conduction channel. Furthermore, the source and/or drain of the FET may also be strained. An as example and not limitations, strained Si may be provided, where the lattice constant of Si may be modified for example through externally applied stress, which may lead to enhanced electronic properties of the strained Si conduction channel and the FET.

The respective FET 400a, 400b, 400c, further includes a gate 408 that may at least substantially surround the conduction channel 404. In the embodiment of FIG. 4A, the gate 408 is electrically coupled to two sides of the conduction channel 404, thereby providing double-gated FET. In the embodiment of FIG. 4B, the gate 408 is electrically coupled to three sides of the conduction channel 404, thereby providing tri-gated FET. In the embodiment of FIG. 4C, the gate 408 is electrically coupled to all sides of the conduction channel 404 (i.e. the gate 408 completely surrounds the conduction channel 404), thereby providing a gate-all-around FET.

The respective FET 400a, 400b, 400c, further includes a gate dielectric 406 configured to separate the gate 408 from the conduction channel 404. For the embodiment of FIG. 4A, the FET 400a further includes gate dielectric 410 that is a much thicker dielectric than the gate dielectric 406, such that the gate 408 is too far to control the conduction channel 404 from that side (e.g. top side 411a) of the conduction channel 404. In other words, the FET 400a may not be controlled by a top gate. Therefore, the FET 400a as shown in FIG. 4A may be effectively controlled by a left gate (on a left side 411b of the conduction channel 404) and/or a right gate (on a right side 411c of the conduction channel 404) and hence the FET 400a is a double-gated FET.

For the FET 400b of FIG. 4B, the FET 400b may be controlled by a top gate (on a top side 412a of the conduction channel 404), a left gate (on a left side 412b of the conduction channel 404) and/or a right gate (on a right side 412c of the conduction channel 404). Therefore, the FET 400b is a tri-gated FET.

For the FET 400c of FIG. 4C, the FET 400c may be controlled by the gate 408 that is at least substantially surrounding the periphery of the conduction channel 404, thereby providing a gate-all-around FET In the embodiments of FIGS. 4A to 4C, the gate dielectric 406 may include an oxide, such as but not limited to silicon oxide, and high-k oxides (e.g. oxides with a high dielectric constant, k) such as hafnium oxide, aluminum oxide, hafnium-aluminum oxide. In various embodiments, the gate dielectric 410 is an insulator and has a much thicker dimension than the gate dielectric 406. The gate dielectric 410 may include silicon nitride or a material that is at least substantially similar to the material of the gate dielectric 406, that is an oxide, such as but not limited to silicon oxide, and high-k oxides (e.g. oxides with a high dielectric constant, k) such as hafnium oxide, aluminum oxide, hafnium-aluminum oxide.

Figure 4D:
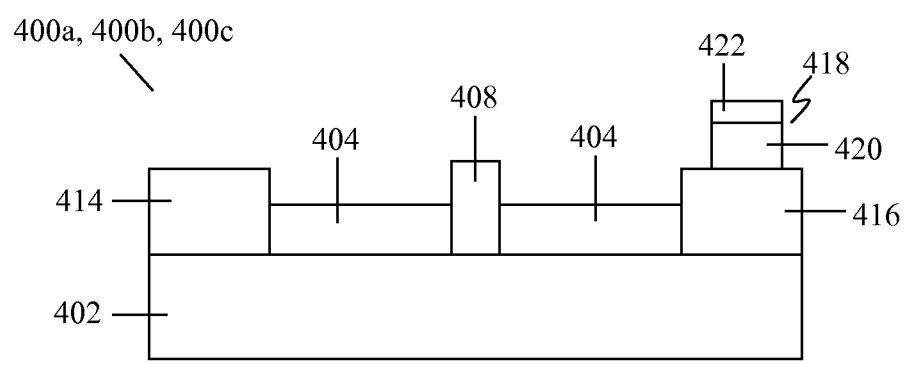
FIG. 4D shows a schematic side view of the field effect transistor (FET)s of the embodiments of FIGS. 4A to 4C.

FIG. 4D shows a schematic side view of the field effect transistor (FET)s 400a, 400b, 400c, respectively, of the embodiments of FIGS. 4A to 4C. As shown in FIG. 4D, a source region (e.g. 414) including a source terminal and a drain region (e.g. 416) including a drain terminal may be provided on either end of the conduction channel 404. A memory component 418, including a storage component 420 including a resistance changing material (e.g. a phase change material), and a top contact 422 may be deposited on, for example, the drain region 416 While FIG. 4D shows that the gate 408 partially surrounds the conduction channel 404 (e.g. in embodiments with FINFETs) such that only a portion of the conduction channel 404 is surrounded by the gate 408, it should be appreciated that the gate 408 may at least substantially completely surround the conduction channel 404 throughout the length of the conduction channel 404 (e.g. in embodiments with nanowire FETs). In addition, the memory component 418 may be deposited on the source region 414, instead of or in addition to the drain region 416.

Figure 5A:
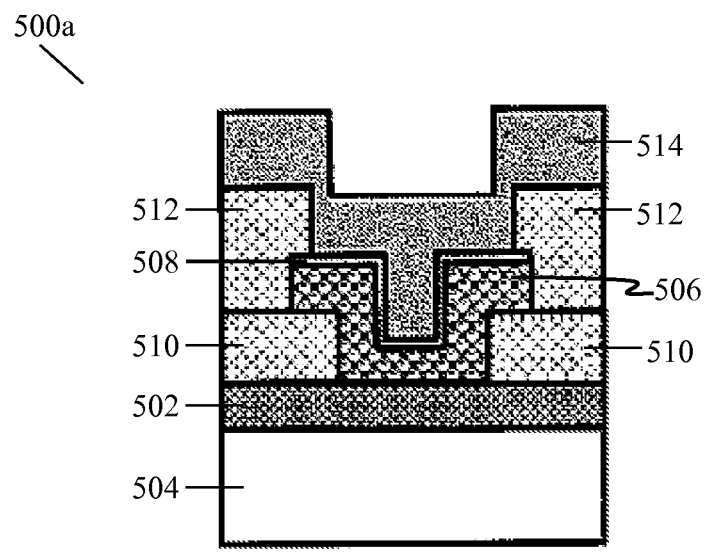
FIGS. 5A to 5C show schematic cross-sectional views of a memory component, according to various embodiments.

FIG. 5A shows a schematic cross-sectional view of a memory component 500a, according to various embodiments. The memory component 500a is integrated with a silicide bottom electrode or contact 502 on silicon 504. The silicide contact 502 and silicon 504 may be part of an access device, for example a MOSFET. The memory component 500a has a U-shaped configuration.

The memory component 500a includes a storage component 506 having a phase change material. The storage component 506 has an at least substantially U shape and may be capped with a layer of metal 508, such as a layer of titanium-tungsten (TiW), titanium-nitride ($Ti_xN_y$), or tungsten (W). The memory component 500a further includes insulators or dielectrics (e.g. $SiO_2$) 510, 512, that partially surround the storage component 506, to provide thermal confinement. The insulators 510, 512 are formed at different stages, for example the insulator 510 is formed before the formation of the storage component 506 while the insulator 512 is formed after the formation of the storage component 506 and the layer of TiW 508. The memory component 500a further includes a top electrode or contact 514 of TiW.

Figure 5B:
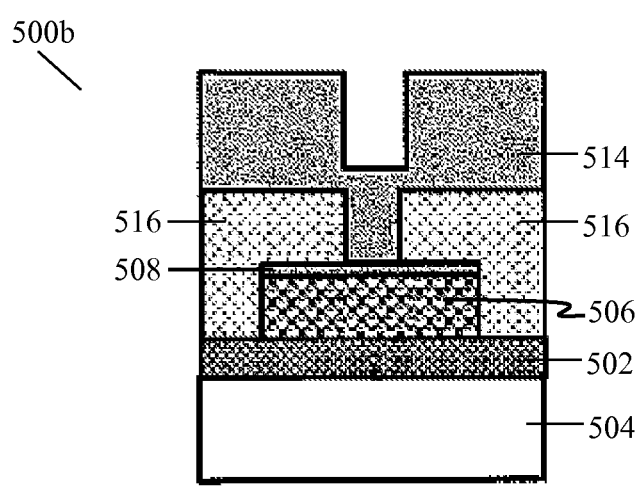

FIG. 5B shows a schematic cross-sectional view of a memory component 500b, according to various embodiments. The memory component 500b is integrated with a silicide bottom electrode or contact 502 on silicon 504. The silicide contact 502 and silicon 504 may be part of an access device, for example a MOSFET. The memory component 500b has an inverted-T configuration.

The memory component 500b includes a storage component 506 having a phase change material. The storage component 506 has an at least substantially rectangular shape and may be capped with a layer of metal 508, such as a layer of titanium-tungsten (TiW), titanium-nitride ($Ti_xN_y$), or tungsten (W). The memory component 500a further includes an insulator or a dielectric (e.g. $SiO_2$) 516, that partially surrounds the storage component 506, to provide thermal confinement. The memory component 500a further includes a top electrode or contact 514 of TiW. The storage component 506 and the layer of TiW 508, bounded by the insulator 516, with an opening through which the top contact 514 is in contact with the storage component 506, is in an inverted-T configuration.

Figure 5C:
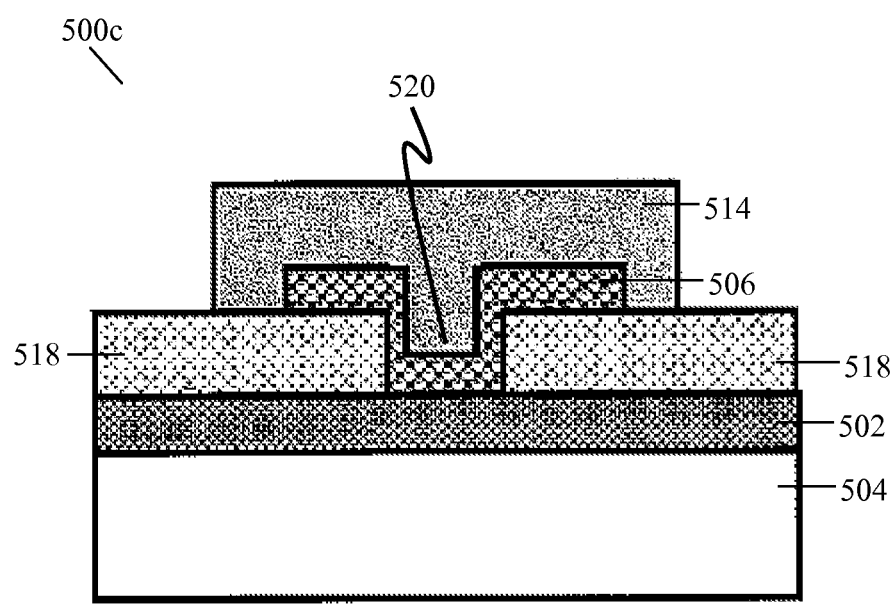

FIG. 5C shows a schematic cross-sectional view of a memory component 500c, according to various embodiments. The memory component 500c is integrated with a silicide bottom electrode or contact 502 on silicon 504. The silicide contact 502 and silicon 504 may be part of an access device, for example a MOSFET. The memory component 500c has a line-typed configuration.

The memory component 500c includes a storage component 506 having a phase change material. The storage component 506 has an at least substantially U shape formed in between an insulator or a dielectric (e.g. $SiO_2$) 518 that partially surrounds the storage component 506 to provide thermal confinement. The storage component 506 includes a thin line structure 520 in between the insulator 518, thereby providing a line-typed configuration. The memory component 500c further includes a top electrode or contact 514 of TiW.

Figure 6A:
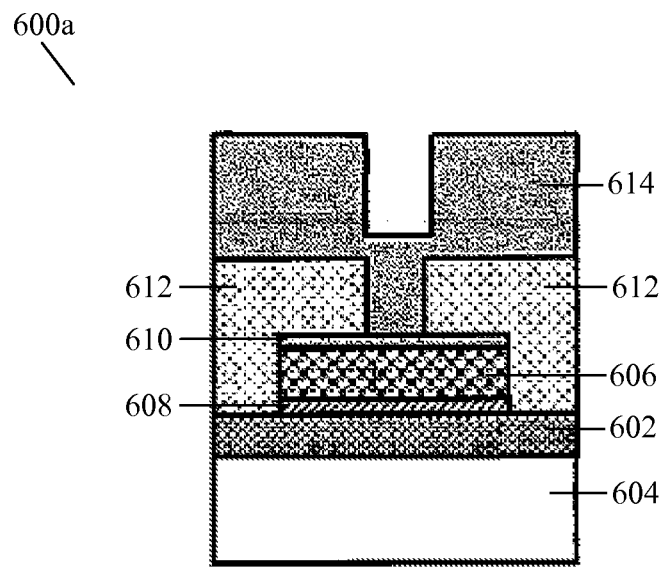
FIGS. 6A to 6C show schematic cross-sectional views of a memory component including a dielectric layer, according to various embodiments.
Figure 6B:
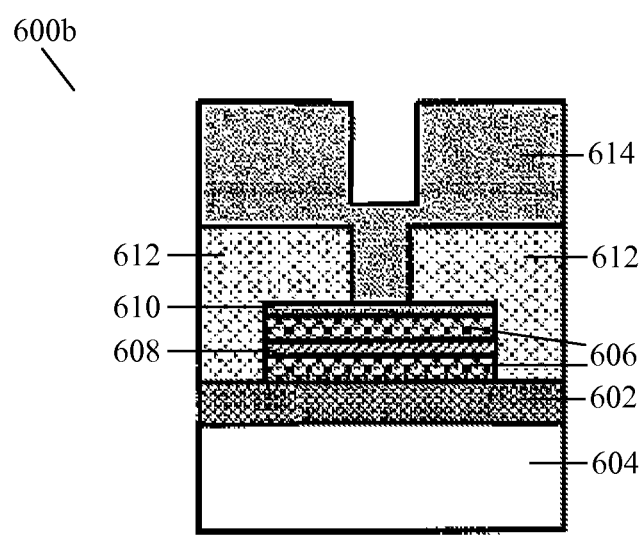
Figure 6C:
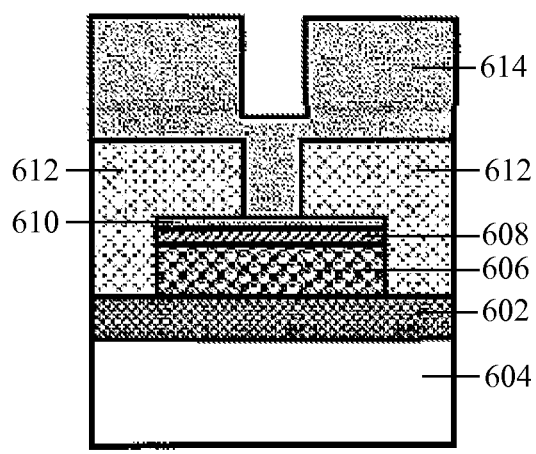

FIGS. 6A to 6C show schematic cross-sectional views of a memory component 600a, 600b, 600c, respectively, including a dielectric layer, according to various embodiments.

The respective memory component 600a, 600b, 600c, is integrated with a silicide bottom electrode or contact 602 on silicon 604. The silicide contact 602 and silicon 604 may be part of an access device, for example a MOSFET. The respective memory component 600a, 600b, 600c, has an inverted-T configuration, similar to the embodiment of FIG. 5B.

Each of the memory component 600a, 600b, 600c, includes a storage component 606 having a phase change material and may be capped with a layer of metal 610, such as a layer of titanium-tungsten (TiW), titanium-nitride ($Ti_xN_y$), or tungsten (W). Each of the memory component 600a, 600b, 600c, further includes an insulator or dielectric (e.g. $SiO_2$) 612, that partially surrounds the storage component 606, to provide thermal confinement. Each of the memory component 600a, 600b, 600c, further includes a top electrode or contact 614 of TiW.

Each of the memory component 600a, 600b, 600c, further includes a dielectric layer 608 disposed in contact with the respective storage component 606. The dielectric layer 608 is provided in order to provide thermal confinement to the storage component 606 having the phase change material.

For the embodiment of FIG. 6A, the dielectric layer 608 is disposed below the storage component 606 such that it is arranged in between the silicide contact 602 and the storage component 606.

For the embodiment of FIG. 6B, the dielectric layer 608 is disposed within the storage component 606 such that it is sandwiched by the phase change material.

For the embodiment of FIG. 6C, the dielectric layer 608 is disposed over the storage component 606 such that it is arranged in between the storage component 606 and the layer of metal 610.

In various embodiments, each of the dielectric layer 608 may include a single layer or multiple layers, for example two layers, three layers, four layers or any higher number of layers.

In various embodiments, a dielectric layer 608 is provided. However, it should be appreciated that any number of dielectric layers may be provided, such as two, three, four or any higher number of the dielectric layer. For example, a first dielectric layer may be arranged in between the silicide contact 602 and the storage component 606 and a second dielectric layer may be arranged in between the storage component 606 and the layer of metal 610. In addition, a first dielectric layer and a second dielectric layer may be inserted or disposed in the storage component 606, thereby providing or creating alternating dielectric and storage component layers. Therefore, it should be appreciated that any combinations of two dielectric layers, three dielectric layers or any higher number of dielectric layers may be possible.

Furthermore, while FIGS. 6A to 6C show that the dielectric layer 608 is provided for the respective memory component 600a, 600b, 600c, having a similar configuration to the configuration of the memory component 500b of FIG. 5B, it should be appreciated that one or more dielectric layers may be similarly provided to a memory component having a similar configuration to the memory component 500a of FIG. 5A and memory component 500c of FIG. 5C, such that descriptions relating to the embodiments of FIGS. 6A to 6C relating to the dielectric layer 608 may correspondingly be applicable.

Figure 7A:
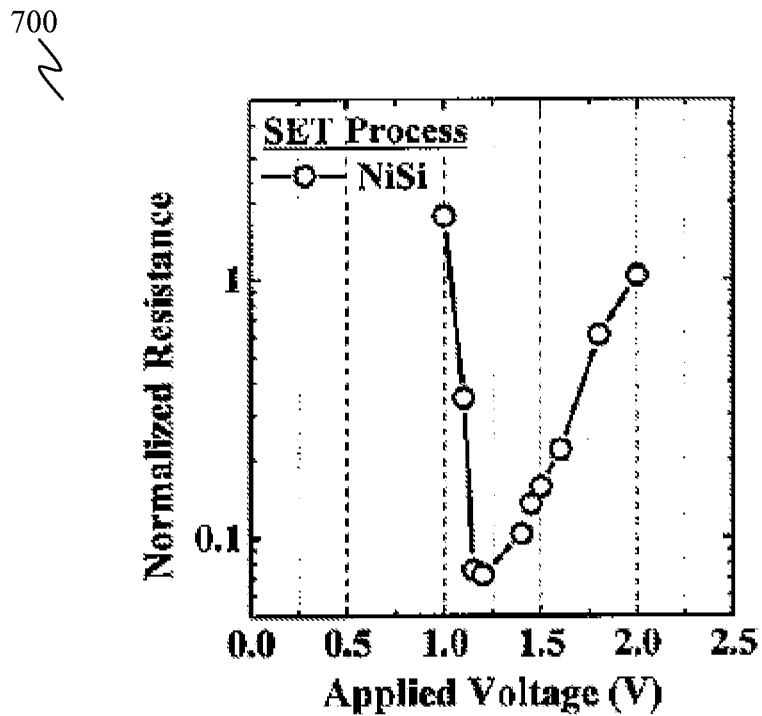
FIGS. 7A to 7C show plots of resistance-voltage (R-V) characteristics of a memory component with a nickel monosilicide (NiSi) bottom electrode, according to various embodiments.
Figure 7B:
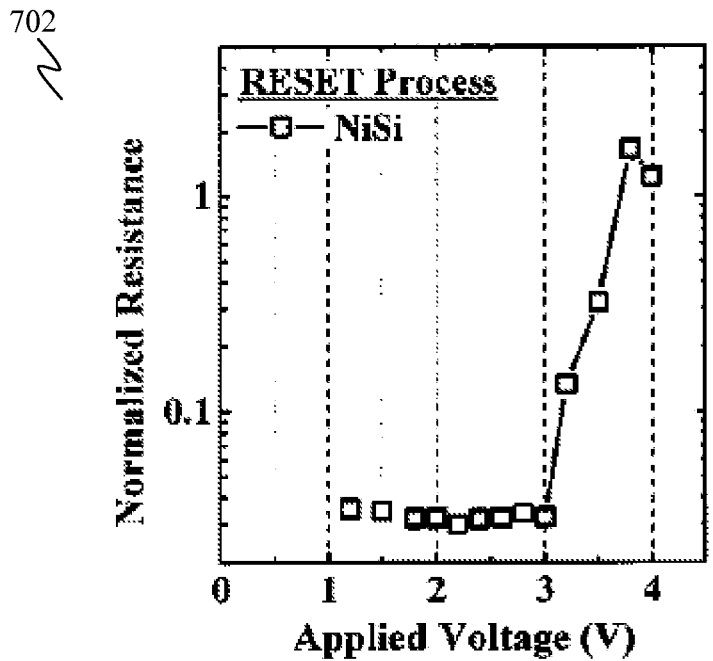
Figure 7C:
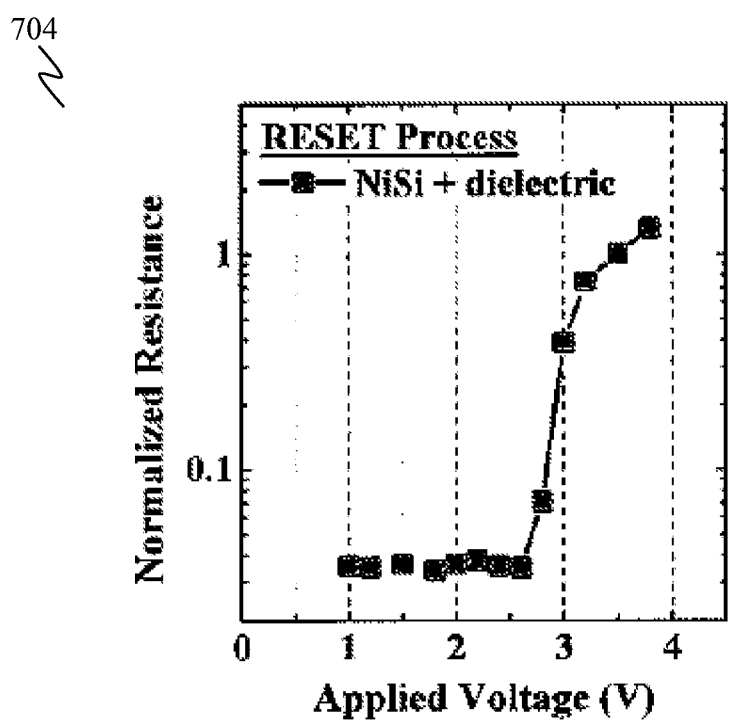

FIGS. 7A to 7C show plots of R-V characteristics of a memory component (e.g. a PCRAM) with a NiSi bottom electrode, according to various embodiments. The memory device includes nitrogen-doped $Ge_2Sb_2Te_5$ phase change material for the storage component.

FIG. 7A show a plot 700 of pulse R-V characteristics for a SET operation (i.e. when the phase change material switches from an amorphous phase to a crystalline phase), while FIG. 7B show a plot 702 of pulse R-V characteristics for a RESET operation (i.e. when the phase change material switches from a crystalline phase to an amorphous phase). FIG. 7C show a plot 704 of pulse R-V characteristics for a RESET operation, where the memory component includes a thin dielectric layer (e.g. $Ta_2O_5$) for thermal confinement. The thin dielectric layer may be at least substantially similar to the dielectric layer 608 of FIGS. 6A to 6C. An electrical pulse, e.g. a current pulse, may be used to program the memory component, for example to switch the phase of the phase change material.

As shown in FIGS. 7A to 7C, distinct states in the high-resistive phase and the low-resistive phase may be observed, with approximately one order of magnitude difference in the resistance. The results show that the memory component with a NiSi bottom electrode show a non-volatile memory behaviour.

In addition, as shown in FIGS. 7A and 7B, for the RESET operation, a larger applied voltage is required for switching, due to the higher temperature required in the melting process to switch from the crystalline phase to the amorphous phase, as compared to the SET operation. However, as shown in FIG. 7C, the voltage required may be decreased by providing a dielectric layer. As the dielectric layer provides thermal confinement, a lower switching voltage is required.

Fabrication of the memory component and the measurement results are now described by way of examples and not limitations.

Figure 8:
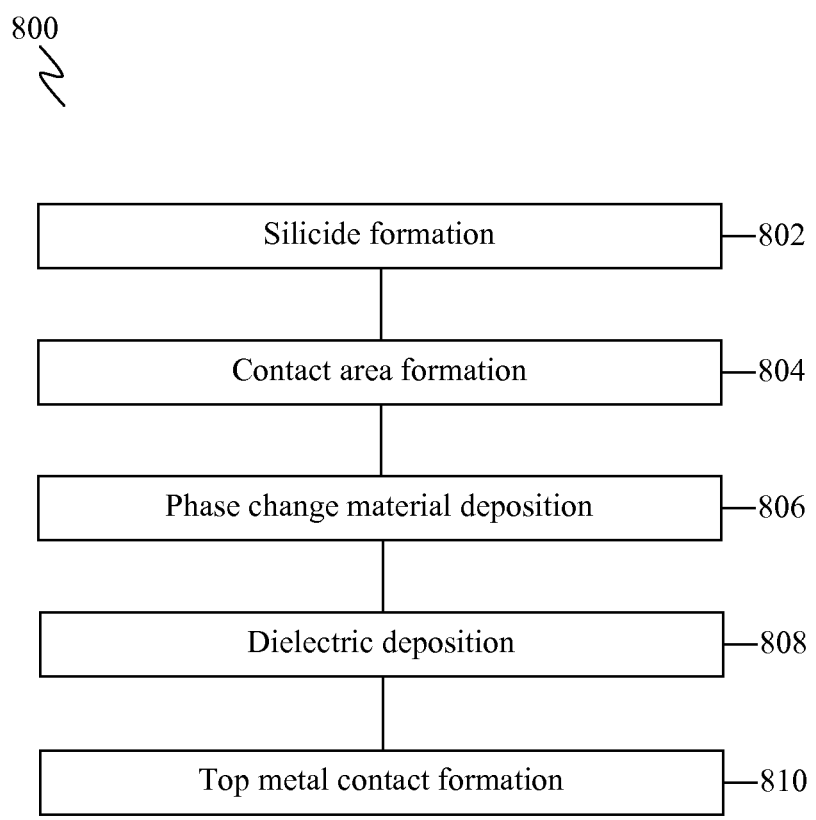
FIG. 8 shows a flow chart illustrating a method of forming a memory component, according to various embodiments.

FIG. 8 shows a flow chart 800 illustrating a method of forming a memory component (e.g. a PCRAM), according to various embodiments.

At 802, a silicide bottom electrode or contact is formed. The silicide may be, for example, but not limited to, nickel monosilicide (NiSi) or platinum monosilicide (PtSi).

At 804, a contact area is formed. The active contact area may have dimensions of about 1 μm. In various embodiments, smaller dimensions down to 10 nm may be possible. Therefore, the active contact area may have dimensions in a range of between about 10 nm to about 1 μm, for example a range of between about 100 nm to about 800 nm or a range of between about 300 nm to about 600 nm At 806, a phase change material is deposited. Subsequently, a thin layer of metal such as a layer of titanium-tungsten (TiW), titanium-nitride (Ti$_x$N$_y$), or tungsten (W), is formed on the phase change material as a capping layer to cap the phase change material.

At 808, a dielectric is deposited.

At 810, a top metal electrode or contact is formed.

Figure 9A:
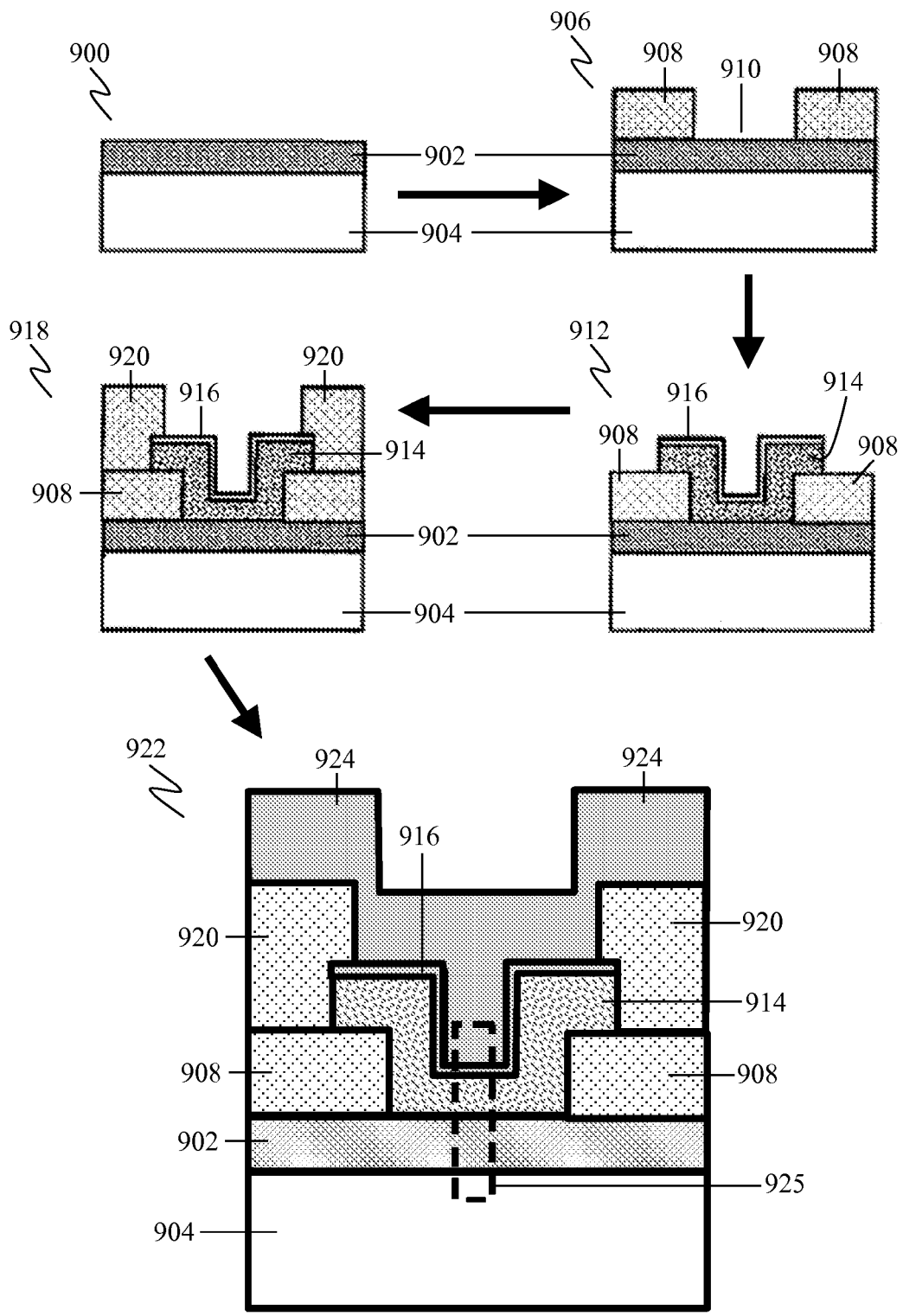
FIG. 9A shows a schematic illustration of a method of forming a memory component, according to various embodiments.

FIG. 9A shows a schematic illustration of a method of forming a memory component (e.g. a PCRAM), according to various embodiments. The method of forming the memory component is now described by way of example and not limitations.

Si substrates with a few hundred nm to several microns thermal silicon oxide (SiO$_2$), or silicon-on-insulator (SOI) substrates may be used as the starting materials. In embodiments using Si substrates, electron beam (e-beam) deposition of about 30 nm to 50 nm silicon onto the SiO$_2$ surface may be performed Subsequently, several nm (e.g. about 5 nm to about 15 nm) of metal (e.g. nickel or platinum) as described above, is deposited onto the Si (e.g. of the Si substrates or the SOI substrates) for formation of the silicide. The thickness of the metal to be deposited varies with the technology node. The deposition of silicon and the metal as described above are performed successively in a vacuum environment. The deposition process is performed for the substrates to obtain a number of samples. The samples may then be silicided using rapid thermal annealing at about 400° C. to about 700° C. for periods ranging from about 10 s to about 2 mins in nitrogen (N$_2$) ambient, in order to form metal silicides. The temperature and annealing period varies with the phase of the silicide required as described above. In other words, for silicides having various phases of a composition of M$_x$Si$_y$, where M is a metal or a transition metal, the annealing period varies depending on whether the phase of the silicide to be formed is, for example, MSi, MSi$_2$, M$_2$Si, MSi$_3$, or M$_2$Si$_2$.

Selective wet etch may then be performed to remove the unreacted metal (i.e. metal as described above that is unreacted following the silicidation process. The thickness of the entire bottom electrode (BE), i.e. metal silicide on Si, may range from between about 20 nm to about 100 nm. As shown in FIG. 9, a structure 900 with a layer of metal silicide (e.g. NiSi or PtSi) 902 on silicon 904 is obtained.

A 100 nm thick dielectric (e.g. SiO$_2$) may then be deposited and patterned to form a contact region (e.g. having contact dimensions of about tens of nm to several microns). In various embodiments, a contact region of a dimension of less than about 100 nm (i.e. 100 nm), for example about 80 nm, about 50 nm, or about 20 nm, may be formed. As shown in FIG. 9, a structure 906 is obtained. The structure 906 includes patterned dielectric (e.g. SiO$_2$) 908 and a contact region 910 where a phase change material may be subsequently deposited into for contact with the silicide bottom electrode 902.

A phase change material may then be deposited. As an example and not limitations, nitrogen-doped Ge$_2$Sb$_2$Te$_5$ (N-GST) may be used as the phase change material, which may be formed by sputtering a Ge$_2$Sb$_2$Te$_5$ composite target in nitrogen/argon (N$_2$/Ar) ambient. The phase change material (e.g. N-GST) layer may be several nm to tens of nm thick (e.g. about 10 nm to about 100 nm), and may contain 0 to about 50 atomic percent (at. %) of nitrogen incorporated in the N-GST layer or film. In various embodiments, the atomic percent of nitrogen may be less than about 10 at. %, for example about 8 at. %, about 5 at. % or about 3.5 at %. A thin layer of titanium-tungsten (TiW), titanium nitride (Ti$_x$N$_y$), or tungsten (W) of about 5 nm to about 10 nm may be deposited to cap the N-GST layer to prevent oxidation of the phase change material (e.g. N-GST), which may adversely affect the device performance. As shown in FIG. 9, a structure 912 is obtained. The structure 912 includes a layer of phase change material (i.e. N-GST layer) 914, capped with a thin layer of TiW 916. The N-GST layer 914 and the thin layer of TiW 916 have a substantially U shape.

About 30 nm to about 100 nm thick dielectric (e.g. SiO$_2$) may then be deposited and patterned. As shown in FIG. 9, a structure 918 including patterned dielectric (e.g. SiO$_2$) 920 is obtained.

Subsequently, about 50 nm to about 200 nm thick titanium-tungsten (TiW) top metallization contact may be formed. As shown in FIG. 9, a structure 922 including TiW top contact 924 is obtained.

Figure 9B:
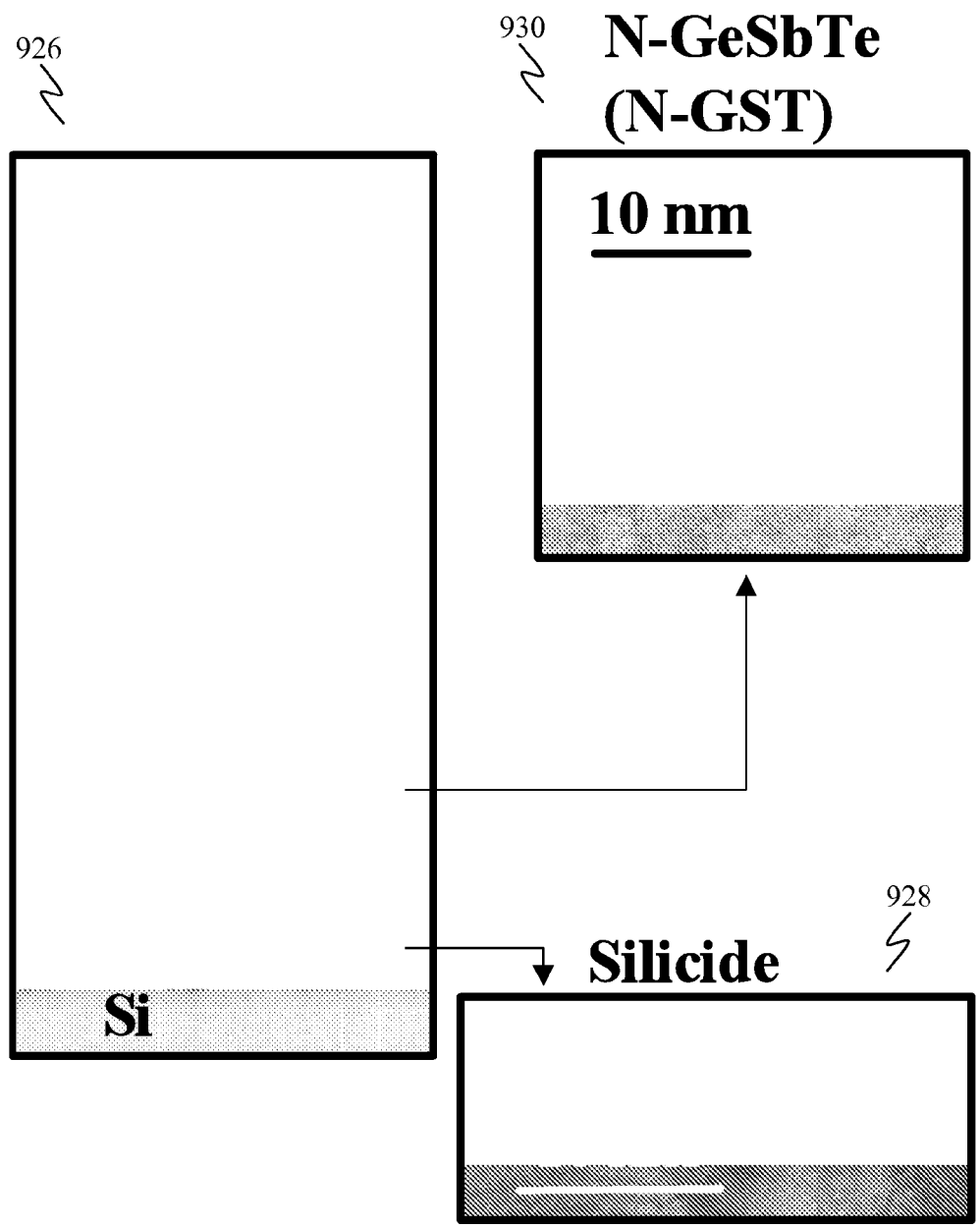
FIG. 9B shows a high-resolution transmission electron microscopy (HRTEM) micrograph corresponding to a contact region of a memory component, according to various embodiments.

High-resolution transmission electron microscopy (HR-TEM) may be used to examine the completed structure (e.g. the structure 922). FIG. 9B shows a HRTEM micrograph 926 corresponding to the contact region of structure 922, at the portion as represented by the dotted box 925, illustrating the different material layers at the contact region. The micrograph 926 shows a silicide layer with a thickness of about 20 nm and the interfaces between the different layers. In addition, the micrograph 928 shows the polycrystalline grains in the silicide layer, while the micrograph 930 shows the clusters of polycrystalline grains in the phase change layer (e.g. N-GST) that is observed after repeated electrical tests, illustrating the polycrystalline nature of the phase change material.

Figure 21A:
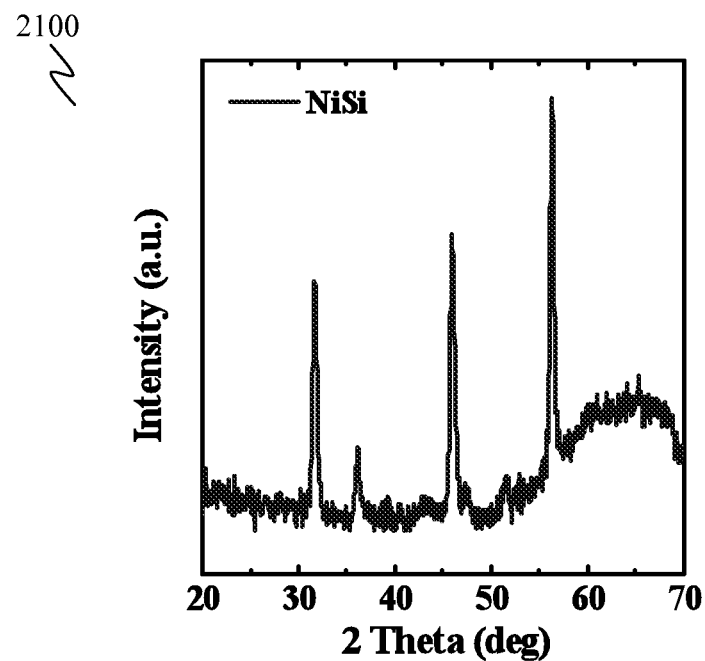
FIGS. 21A and 21B show X-ray diffraction (XRD) analysis results for nickel silicide and platinum silicide, respectively, according to various embodiments.
Figure 21B:
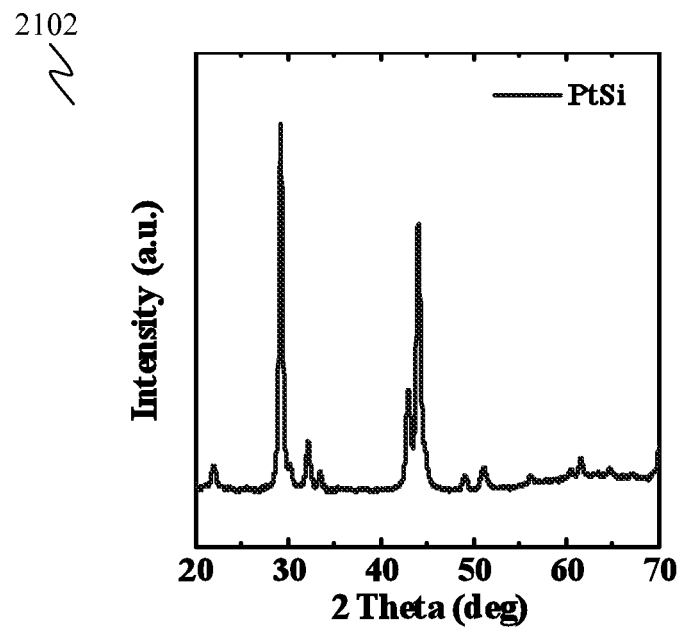

An X-ray diffraction (XRD) analysis may be performed to comfirm the formation of the silicide material. FIGS. 21A and 21B show X-ray diffraction (XRD) analysis results for nickel silicide 2100 and platinum silicide 2102, respectively, according to various embodiments. A number of peaks may beobserved, representing the polycrystalline nature of the silicide material.

Different measurements may be carried out on the fabricated components. The electrical resistivity and thermal conductivity of the bottom contact or electrode, which also functions as a heater in a phase change memory component or memory cell or memory device may affect the performance of a PCRAM. In various embodiments, the heater material should have a high electrical resistivity and a low thermal conductivity for efficient heating.

Figure 10:
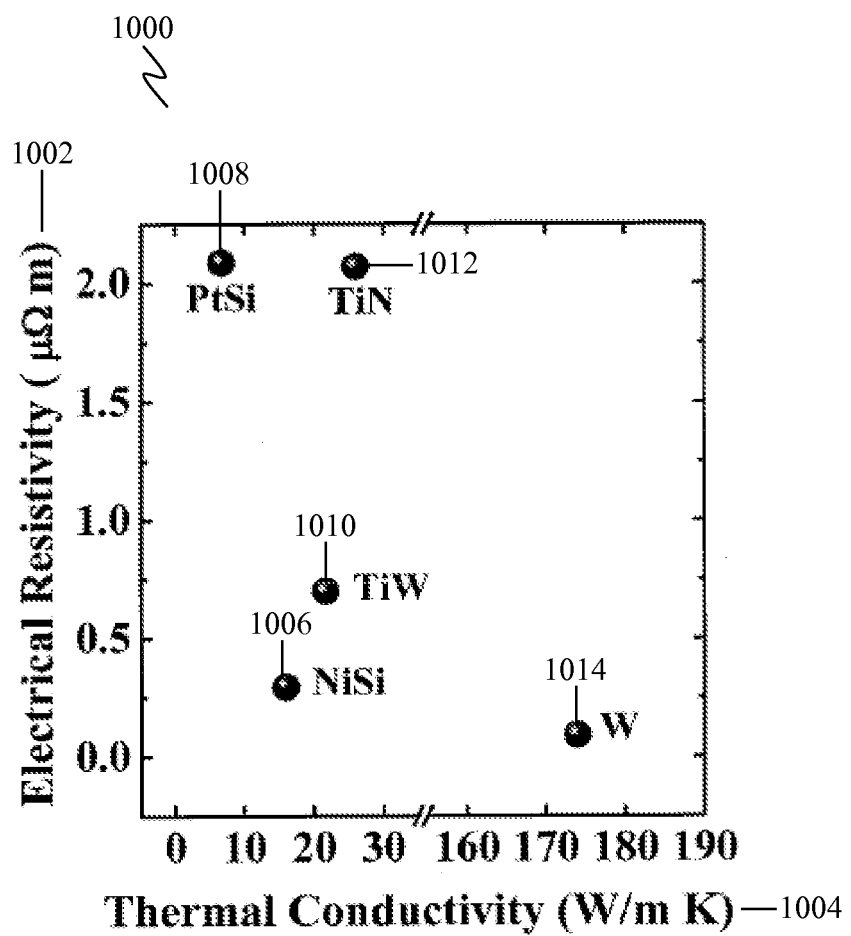
FIG. 10 shows a plot of electrical resistivity and thermal conductivity of contact materials of various embodiments.

FIG. 10 shows a plot 1000 of electrical resistivity 1002 and thermal conductivity 1004 of contact materials of various embodiments. The plot 1000 shows the results for nickel monosilicide (NiSi) 1006, platinum monosilicide (PtSi) 1008, titanium-tungsten (TiW) 1010, titanium-nitride (TiN) 1012 and tungsten (W) 1014. As shown in the plot 1000, TiW 1010 and TiN 1012 have a high electrical resistivity 1002 and a low thermal conductivity 1004, which may facilitate in raising the heating efficicency in a PCRAM cell. The electrical resistivity 1002 and the thermal conductivity 1004 of NiSi 1006 are substantially similar to those of TiW 1010, while those of PtSi 1008 are similar to TiN 1012. As shown in FIG. 10, NiSi 1006 has a thermal conductivity of about 16 W/mK while PtSi 1008 has a thermal conductivity of about 7 W/mK, which are both lower than the thermal conductivity of W 1014 of about 174 W/mK. Therefore, NiSi 1006 and PtSi 1008 when used as the materials for the bottom electrode may provide efficient heaters in a PCRAM cell.

A two-dimensional finite element simulation may be carried out to determine the temperature distribution in components or cells with TiW, and metal silicides (e.g. NiSi and PtSi) bottom electrodes in order to examine the role of silicides as heaters. For the simulation, the material properties are assumed to be temperature invariant and isotropically homogeneous. A voltage pulse is applied to a top electrode of the devices, and the heating effect is simulated. The thermal transfer process obeys the standard heat conduction equation, as given below:

$$\nabla \cdot k \nabla T + Q = c\rho \frac{\partial T}{\partial t},\qquad \text{(Equation 1)}$$

where $\nabla$ is the gradient operator, k is the thermal conductivity, T is the temperature, Q is the Joule heat per unit volume and time, c is the specific heat capacity, $\rho$ is the density, and t is time.

The RESET process or operation (i.e. when the phase change material switches from the crystalline phase to the amorphous phase) is simulated since it has a higher temperature requirement than the SET process (i.e. when the phase change material switches from the amorphous phase to the crystalline phase). The boundary condition at the top surface of the top electrode (e.g. 924 of FIG. 9) and the bottom of the substrate may be set at room temperature (e.g. about 22° C. to about 30° C.). In addition, it is assumed that prior to applying the voltage pulse, the device is in thermal equilibrium with its surroundings.

The simulation may be carried out to determine whether the phase change material may be heated to its melting point in devices with silicide bottom electrodes using the same bias condition as devices with a TiW bottom electrode. The simulation may be performed to determine the temperature distribution of a memory cell after being pulsed by an electrical pulse. In various embodiments, the electrical pulse may be of a magnitude of about 0.5 V to about 5 V, and a duration of about 5 ns to about 100 ns.

Figure 11A:
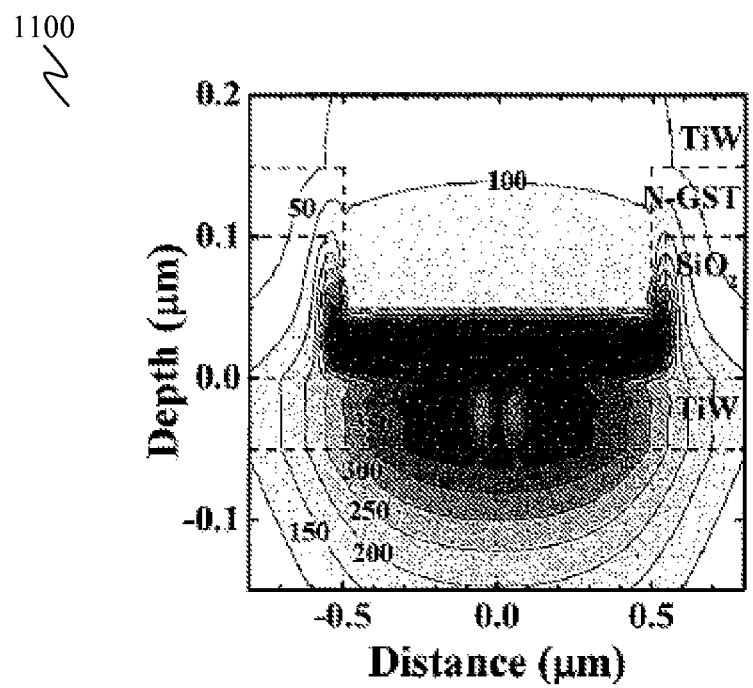
FIGS. 11A, 11B and 11C show simulated temperature distributions of memory components with a titanium-tungsten (TiW), a nickel monosilicide (NiSi) and a platinum monosilicide (PtSi) bottom electrode respectively, according to various embodiments.
Figure 11B:
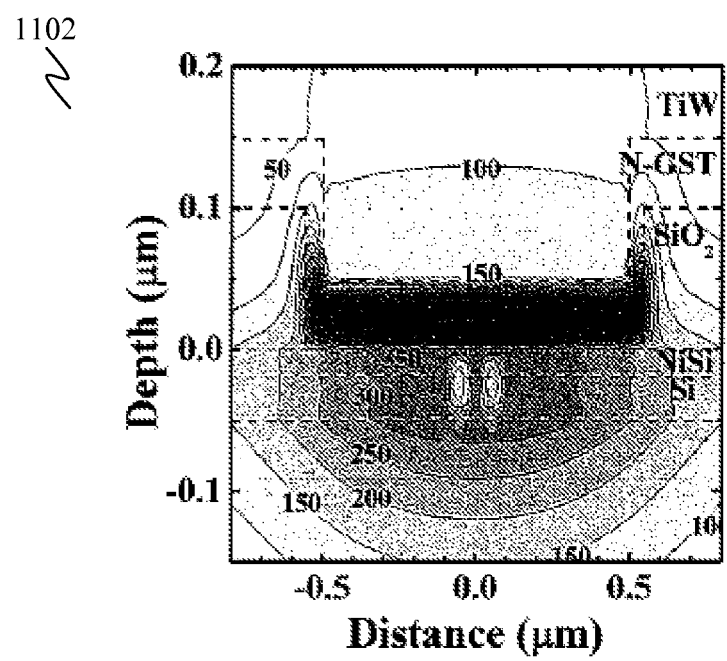
Figure 11C:
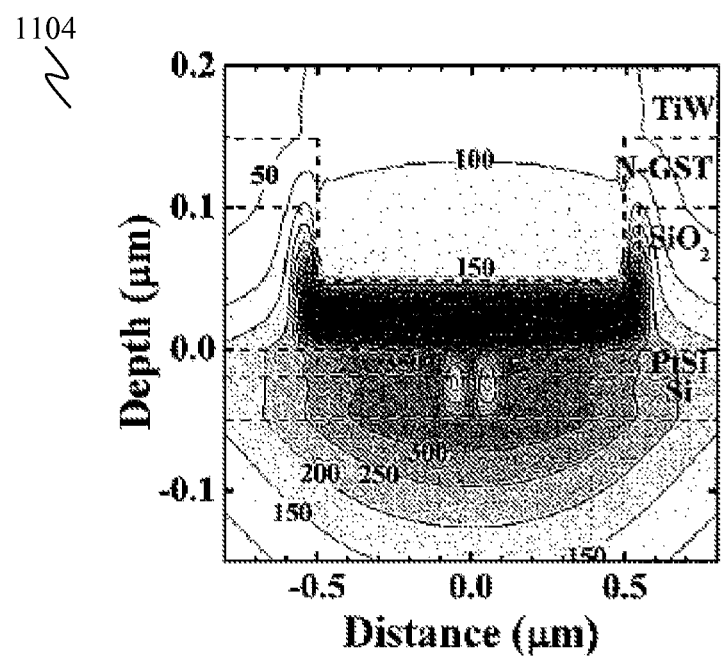

FIG. 11A shows a simulated temperature distribution 1100 of a memory component with a TiW bottom electrode, FIG. 11B shows a simulated temperature distribution 1102 of a memory component with a NiSi bottom electrode, while FIG. 11C shows a simulated temperature distribution 1104 of a memory component with a PtSi bottom electrode. Each of the temperature distributions 1100, 1102, 1104, corresponds to the temperature profile at the end of the pulse period. For each of the memory component, the heating zone with the highest temperatures is confined to the phase change layer (e.g. N-GST).

Figure 11D:
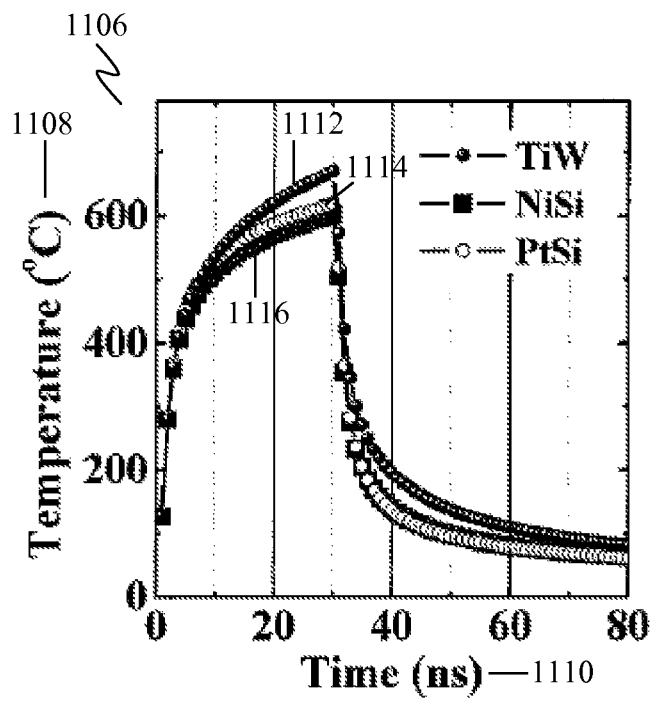
FIG. 11D shows a plot illustrating a change in temperature in the phase change material as a function of time, according to various embodiments.

FIG. 11D shows a plot 1106 illustrating a change in temperature 1108 in the phase change material as a function of time 1110, according to various embodiments. The plot 1106 shows the temperature-time profile, when pulsed by a 0.85 V, 30 ns electrical pulse, at the centre of the phase change layer (e.g. N-GST) during the RESET operation for memory components employing respectively a TiW bottom electrode 1112, a NiSi bottom electrode 1114 and a PtSi bottom electrode 1116.

For a RESET operation, fast heating is provided to quickly ramp up the temperature above the melting point of the phase change material, followed by fast cooling for rapid quenching to convert the phase change material from the crystalline phase to the amorphous phase. The high heating and cooling rates achieved show that silicides may be used as the bottom electrode in PCRAM components and cells.

In addition, as may be observed from FIG. 11D, a peak temperature higher than the melting point of the phase change material (e.g. the melting point is about 600° C.) is obtained for the memory component with the TiW bottom electrode 1112. In addition, peak temperatures higher than 600° C. (for example 602° C. for NiSi bottom electrode 1114 and 618° C. for PtSi electrode 1116) are obtained for the memory component with a NiSi bottom electrode 1114 and the memory component with a PtSi bottom electrode 1116, which are comparable to that with the TiW bottom electrode 1112. Furthermore, the peak temperatures obtained exceed the melting point of the phase change layer, which is about 600° C., thereby enabling the transformation of the phase change material from the crystalline phase to the amorphous phase. Therefore, the results show that silicides may be used as a contact and heater material in memory components (e.g. PCRAM).

The thermal stability of NiSi and PtSi may also be determined. As the crystallization process takes place at a lower temperature than the melting process, the integrity of the silicide films is determined at higher temperatures. The silicided films may be annealed at various temperatures, from about 300° C. to about 700° C., and their sheet resistances are measured. In various embodiments, the sheet resistance refers to a measure of resistance of a thin film that has a uniform thickness.

Figure 12:
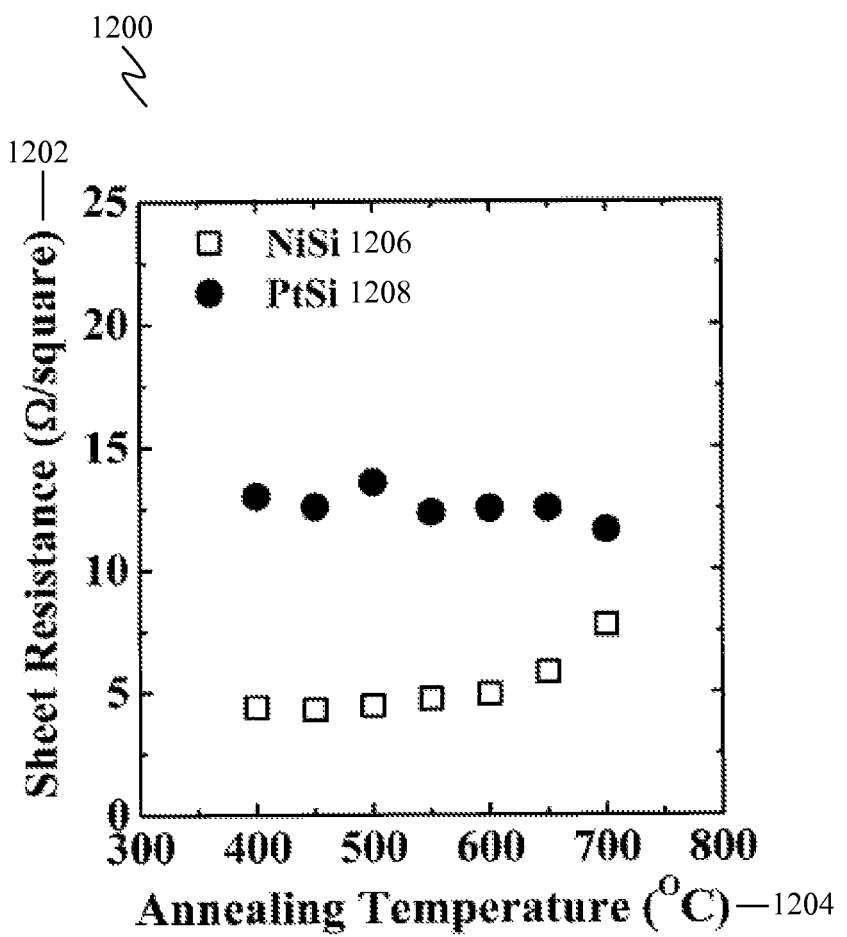
FIG. 12 shows a plot illustrating sheet resistance as a function of annealing temperature for nickel monosilicide (NiSi) and platinum monosilicide (PtSi), according to various embodiments.

FIG. 12 shows a plot 1200 illustrating sheet resistance 1202 as a function of annealing temperature 1204 for NiSi 1206 (denoted by open square data points) and PtSi 1208 (denoted by closed circular data points), according to various embodiments.

As shown in FIG. 12, the sheet resistance 1202 for NiSi 1206 show that the NiSi film does not significantly degrade up to an annealing temperature of about 650° C., while the sheet resistance 1202 for PtSi remains approximately constant for the range of 400° C. to 700° C. The results show that there would be little degradation of the silicide films, even during the RESET operation where a high temperature is provided.

The energy band alignment between the phase change material (e.g. N-GST) and various metal materials may be investigated using X-ray photoelectron spectroscopy (XPS). X-ray techniques such as XPS may be used to determine the Schottky barrier height at metal-dielectric or metal-semiconductor interfaces while method such as the core-level alignment technique may be used to provide information on the barrier height between the phase change material layer and the adjacent metal.

In various embodiments, the hole barrier height, $\Phi_b^p$ at the metal/phase change material interface may be given by the equation below:

$$\Phi_b^p = E_V - E_{CL} + E_{CL}(i) \qquad \text{(Equation 2)},$$

where $E_V$ and $E_{CL}$ are the valence band maximum and the peak core-level binding energies of bulk metal, respectively, and $E_{CL}(i)$ is the peak core-level measurement made at the phase change material/metal interface.

XPS is performed utilizing a monochromatic Al K$\alpha$ x-ray source to analyze the chemical bonding at the interface between N-GST, as the phase change material, and various metal layers, e.g. TiW, NiSi and PtSi. A thin layer of N-GST of about 2 nm to about 5 nm nitrogen may be deposited on different bulk thick metal layers (for example at least 20 nm thick) of TiW, NiSi and PtSi. The binding energies at the interface of the N-GST and the different metal layers are referenced to the Te $3d_{5/2}$ core-level at about 370.1 eV (i.e. the binding energy of an electron in a tellurium (Te) atom having an electron configuration of $3d_{5/2}$). XPS measurements are also performed on 100 nm thick samples for each metal material to obtain the core-level spectra as well as the valence band spectra.

Figure 13A:
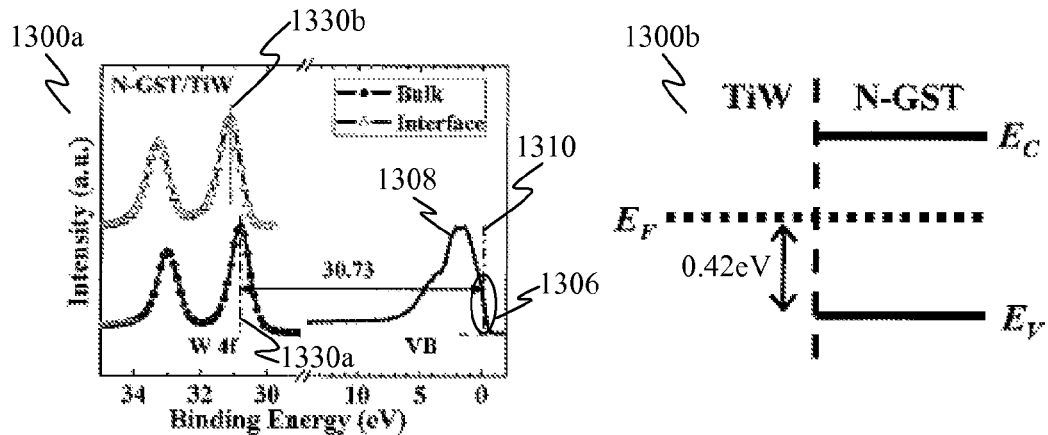
FIGS. 13A, 13B and 13C show X-ray photoelectron spectroscopy (XPS) measurement data for pairs of nitrogen-doped $Ge_2Sb_2Te_5$ (N-GST) with various metals, according to various embodiments.
Figure 13B:
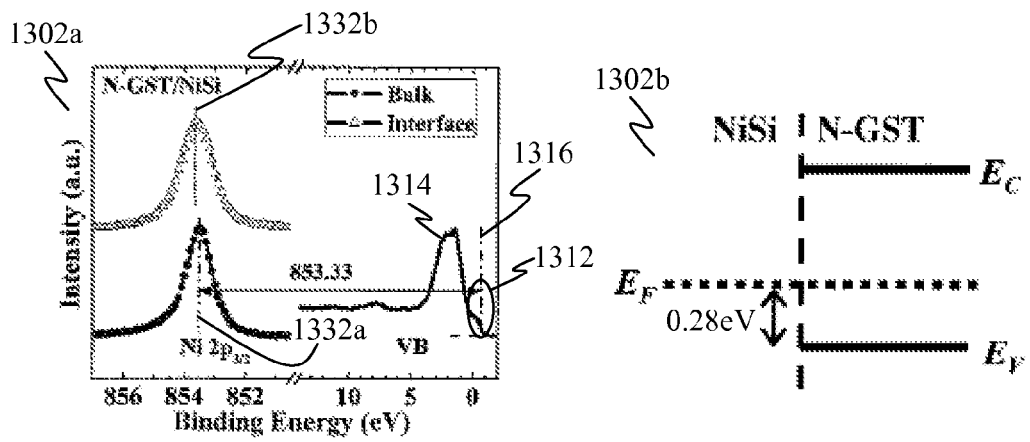
Figure 13C:
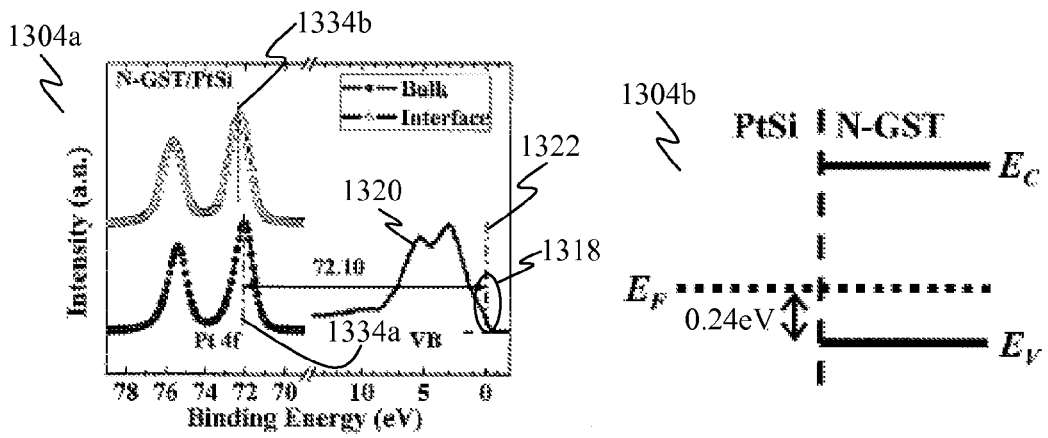

The XPS results are shown in FIGS. 13A to 13C. FIG. 13A shows the XPS measurement data 1300a for N-GST with a TiW bottom electrode, FIG. 13B shows the XPS measurement data 1302a for N-GST with a NiSi bottom electrode while FIG. 13C shows the XPS measurement data 1304a for N-GST with a PtSi bottom electrode. FIGS. 13A to 13C show the core-level spectra for the thin layer of bulk metal films (referred to as "bulk" and as represented by closed circular data points), the core-level spectra for the bulk metal films with a thin layer of phase change material (e.g. N-GST) deposited on the bulk metal (referred to as "interface" and as represented by open triangular data points) and the valence band (VB) spectra (as represented by the solid line). In FIG. 13A, an emission edge (as represented within the oval 1306) may be observed for the VB spectrum 1308, representing the portion of the VB spectrum 1308 where the signal intensity rises rapidly from the "zero" background level. Also indicated in FIG. 13A is the Fermi edge or level, as represented by the dotted line 1310, which is located at the half height of the emission edge derived from the VB spectrum 1308. Similarly, for FIG. 13B, an emission edge (as represented within the oval 1312) may be observed for the VB spectrum 1314, with the Fermi edge or level indicated, as represented by the dotted line 1316, and for FIG. 13C, an emission edge (as represented within the oval 1318) may be observed for the VB spectrum 1320, with the Fermi edge or level indicated, as represented by the dotted line 1322.

In addition, FIGS. 13A to 13C show the respective core-level shift (e.g. the energy difference of the peak core energy value before and after depositing the phase change material on the metal, e.g. the energy difference of the peak core energy value of the "bulk" and the "interface"). For example for FIG. 13A, the core-level shift refers to the difference between the peak core energy value of the bulk (i.e. TiW), as represented by the dotted line 1330a, and the peak core energy value of the interface (i.e. N-GST/TiW), as represented by the dotted line 1330b. Similarly, for FIG. 13B, the core level shift refers to the difference between the peak core energy value of the bulk, as represented by the dotted line 1332a, and the peak core energy value of the interface, as represented by the dotted line 1332b, while for FIG. 13C, the core level shift refers to the difference between the peak core energy value of the bulk, as represented by the dotted line 1334a, and the peak core energy value of the interface, as represented by the dotted line 1334b.

By substituting the measured core-level shifts at the different material interfaces into equation 2, the hole barrier heights, $\Phi_b^p$, between the N-GST and TiW, NiSi and PtSi respectively, are approximately 0.42 eV, 0.28 eV and 0.24 eV. Therefore, the results show that a reduced hole barrier height may be provided at the interface between N-GST and silicides compared to the interface between the N-GST and TiW.

In addition, FIG. 13A shows the energy band diagram 1300b for N-GST/TiW, FIG. 13B shows the energy band diagram 1302b for N-GST/NiSi while FIG. 13C shows the energy band diagram 1304b for N-GST/PtSi, to illustrate the effective band alignments. In the energy band diagrams 1300b, 1302b, 1304b, $E_C$ refers to the conduction band edge, $E_V$ refers to the valence band edge and $E_F$ refers to the Fermi level or edge. The energy band diagrams 1302b, 1304b, show that ohmic contacts are formed using the silicide materials, thereby enabling a high current to be achieved for Joule heating in the N-GST.

In various embodiments, GST includes about 20% vacancies in its structure and conducts current by holes. Minute concentrations of the added nitrogen is not expected to alter the type of conduction. In various embodiments, increasing the electrode work function may give a smaller hole barrier with respect to the valence band of the N-GST. As compared with the hole barrier height between TiW and N-GST, the hole barrier height is lower between NiSi or PtSi and N-GST. The results show that the contact resistivity for the N-GST/silicide ohmic contact is lower or smaller compared to that with TiW, thereby providing a higher current for joule heating in the phase change layer (i.e. N-GST) for a given bias condition.

The electrical characteristics of memory components (e.g. PCRAM) of various embodiments, with NiSi or PtSi as the bottom electrode are determined and shown in FIGS. 14A to 14D.

Figure 14A:
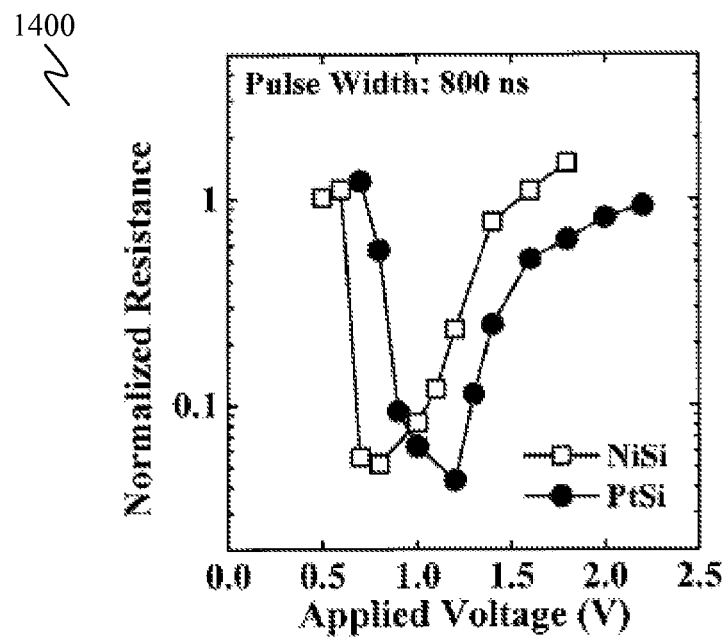
FIGS. 14A to 14D show plots of resistance-voltage (R-V) characteristics of memory components with a nickel monosilicide (NiSi) or a platinum monosilicide (PtSi) bottom electrode, according to various embodiments.
Figure 14B:
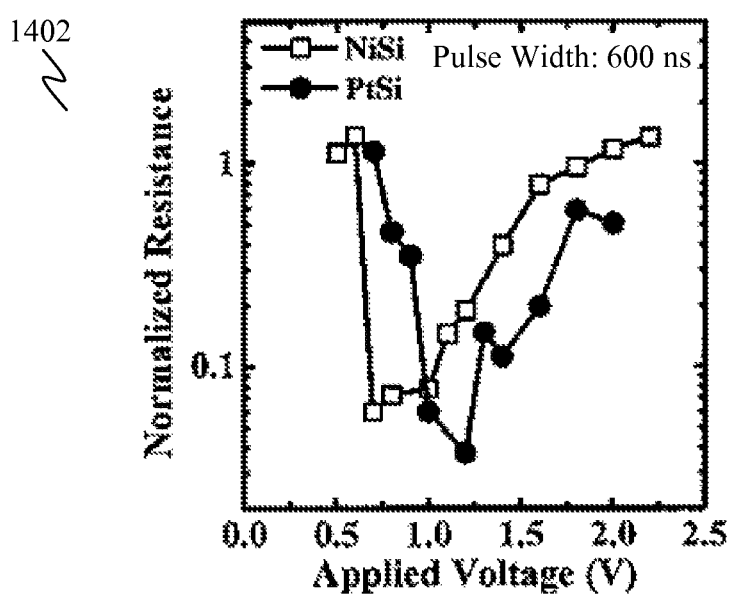

FIG. 14A shows a plot 1400 of R-V characteristic of memory components with a NiSi or a PtSi bottom electrode using a fixed pulse width of about 800 ns while FIG. 14B shows a plot 1402 of R-V characteristic of memory components with a NiSi or a PtSi bottom electrode using a fixed pulse width of about 600 ns. The phase change material is initially programmed in the amorphous phase and the pulse applied may be a current or a voltage pulse used to program the memory component, for example to switch the phase of the phase change material.

Figure 14C:
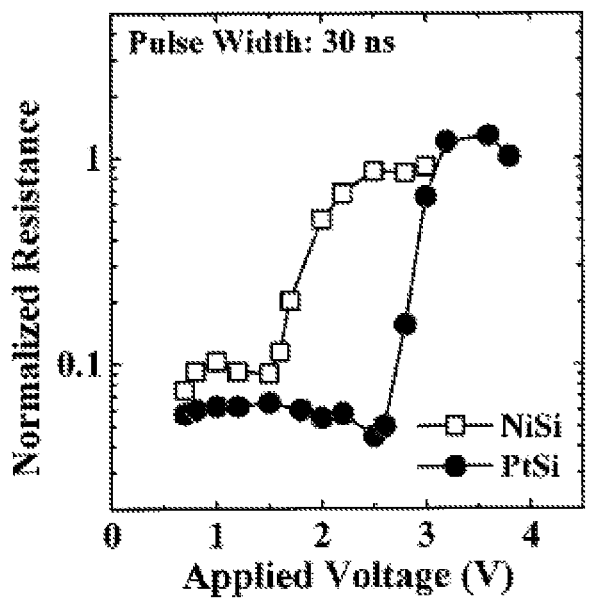
Figure 14D:
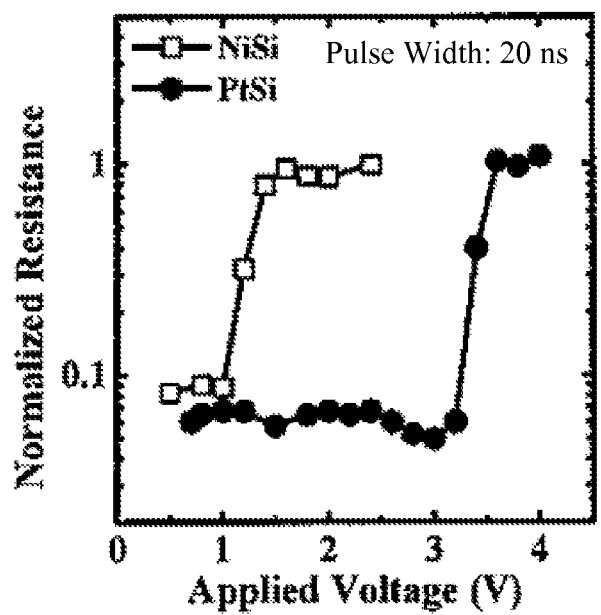

FIG. 14C shows a plot 1404 of R-V characteristic of memory components with a NiSi or a PtSi bottom electrode using a fixed pulse width of about 30 ns. FIG. 14D shows a plot 1406 of R-V characteristic of memory components with a NiSi or a PtSi bottom electrode using a fixed pulse width of about 20 ns. The phase change material is initially programmed in the crystalline phase and the pulse applied may be a current or a voltage pulse used to program the memory component, for example to change the phase of the phase change material.

The plots 1400, 1402, 1404, 1406, are normalised to the RESET resistance of the respective memory component. In the plots 1400, 1402, 1404, 1406, results for the memory component with a NiSi bottom electrode are represented by open square data points while results for the memory component with a PtSi bottom electrode are represented by closed circular data points.

As shown in FIGS. 14A to 14D, distinct states in the high-resistive phase and the low-resistive phase may be observed, with approximately one order of magnitude difference in the resistance. Furthermore, these R-V characteristics show that silicide materials may be used as the bottom electrode in memory components and cells such as PCRAM.

In addition, FIGS. 14A to 14D show that memory components with a NiSi bottom electrode switch at a lower applied voltage than memory components with a PtSi bottom electrode. The lower electrical resistivity or resistance of NiSi enables the generation of a higher current at lower applied voltages for heating the phase change layer for phase transformation.

In addition, as shown in FIGS. 14A to 14D, for the RESET operation where the phase change material switches from the crystalline phase to the amorphous phase, corresponding to the plots 1404 (FIG. 14C) and 1406 (FIG. 14D), a larger applied voltage is required due to the higher temperature required in the melting process to switch from the crystalline phase to the amorphous phase, as compared to the SET operation where the phase change material switches from the amorphous phase to the crystalline phase, corresponding to the plots 1400 (FIG. 14A) and 1402 (FIG. 14B).

Furthermore, FIGS. 14A to 14D show that the memory components with a NiSi bottom electrode or a PtSi bottom electrode show non-volatile memory behaviour.

Figure 15A:
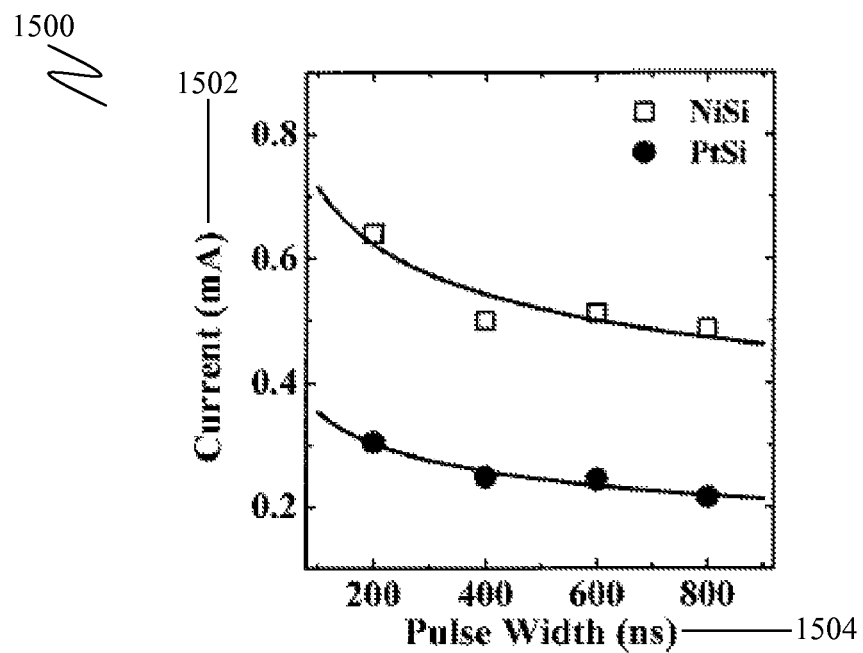
FIG. 15A shows a plot of SET programming current as a function of pulse width, according to various embodiments.
Figure 15B:
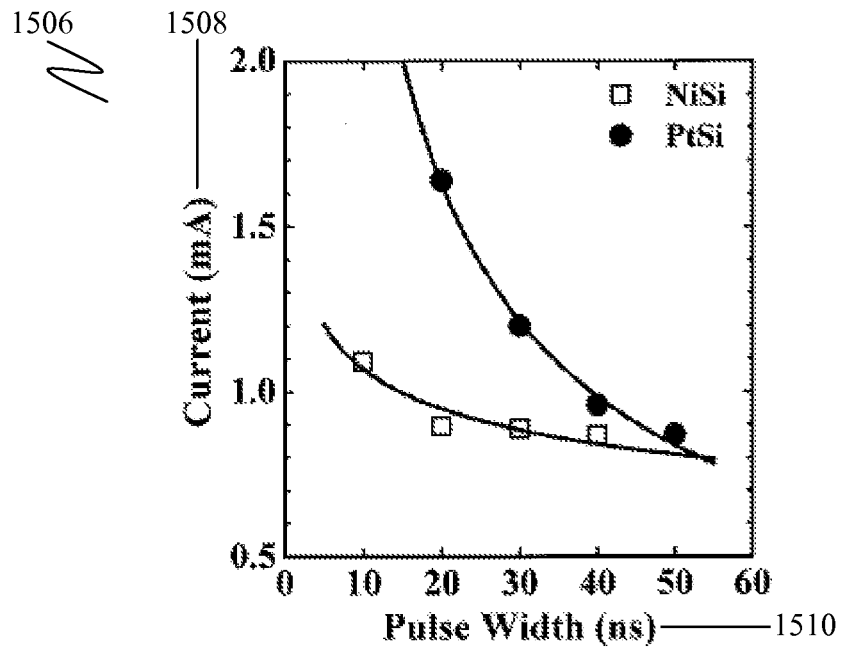
FIG. 15B shows a plot of RESET programming current as a function of pulse width, according to various embodiments.

The dependence of programming currents on the pulse width is determined and the results are shown in FIGS. 15A and 15B. FIG. 15A shows a plot 1500 of SET programming current 1502 as a function of pulse width 1504, according to various embodiments. The SET programming current 1502 is defined as the current in which the programming curve exhibits an abrupt drop in resistance. FIG. 15B shows a plot 1506 of RESET programming current 1508 as a function of pulse width 1510, according to various embodiments. The RESET programming current 1508 is defined as the current in which the programming curve exhibits an initial rise in resistance. In the plots 1500, 1502, results for the memory component with a NiSi bottom electrode are represented by open square data points while results for the memory component with a PtSi bottom electrode are represented by closed circular data points. The memory components have contact dimensions of about 1 μm. In various embodiments, the contact dimensions may be less than 20 nm, for example about 2 nm, about 5 nm, about 10 nm or about 15 nm.

As shown in FIG. 15A, a fast programming time may be achieved as a crystallisation process may be achieved with a current pulse with a pulse width of about 200 ns. As the pulse width 1504 increases, the magnitude of the current 1502 required decreases for both the memory components with NiSi and PtSi bottom electrodes.

In addition, as shown in FIG. 15B, a low RESET current of less than about 1 mA in the RESET operation may be achieved at short programming pulse widths, for memory components with a NiSi bottom electrode and a PtSi bottom electrode, respectively. Similar to the SET programming current 1502, as the pulse width 1510 increases, the magnitude of the current 1508 required decreases for both the memory components with NiSi and PtSi bottom electrodes.

The results of FIGS. 15A and 15B show that low programming currents of less than about 0.8 mA may be sufficient to program the memory components of various embodiments.

Figure 16A:
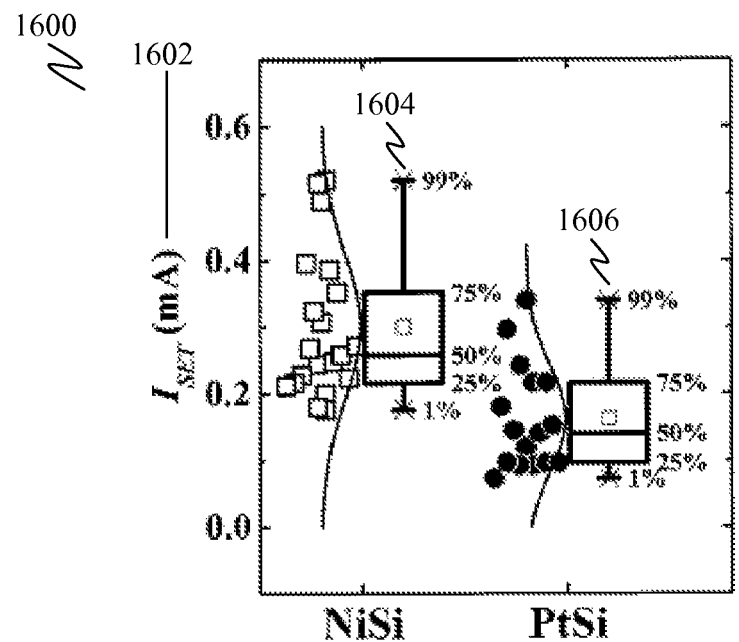
FIG. 16A shows a current distribution plot of SET current of memory components with silicided bottom electrodes, according to various embodiments.

FIG. 16A shows a current distribution plot 1600 of SET current 1602 of memory components with silicided bottom electrodes, according to various embodiments. As shown by the box plot 1604, the median (corresponding to the 50% line of the box plot 1604) SET current, $I_{SET}$, for the memory components with a NiSi bottom electrode is less than about 0.3 mA. As shown by the box plot 1606, the median (corresponding to the 50% line of the box plot 1606) SET current, $I_{SET}$, for the memory components with a PtSi bottom electrode is less than about 0.2 mA.

Figure 16B:
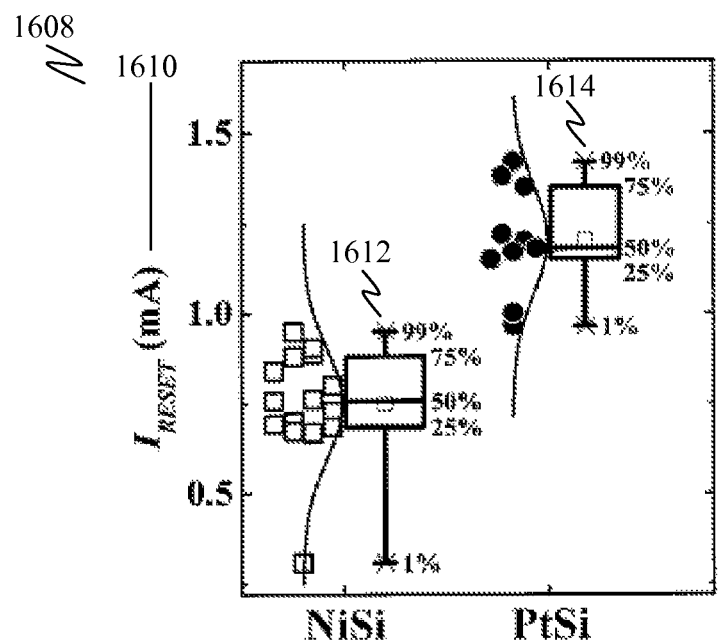
FIG. 16B shows a current distribution plot of RESET current of memory components with silicided bottom electrodes, according to various embodiments.

FIG. 16B shows a current distribution plot 1608 of RESET current 1610 of memory components with silicided bottom electrodes, according to various embodiments. The RESET current 1610 has a pulse width of about 30 ns. As shown by the box plot 1612, the median (corresponding to the 50% line of the box plot 1612) RESET current, $I_{RESET}$, for the memory components with a NiSi bottom electrode is less than about 0.8 mA. As shown by the box plot 1614, the median (corresponding to the 50% line of the box plot 1614) RESET current, $I_{RESET}$, for the memory components with a PtSi bottom electrode is between about 1 mA to about 1.2 mA.

Figure 17A:
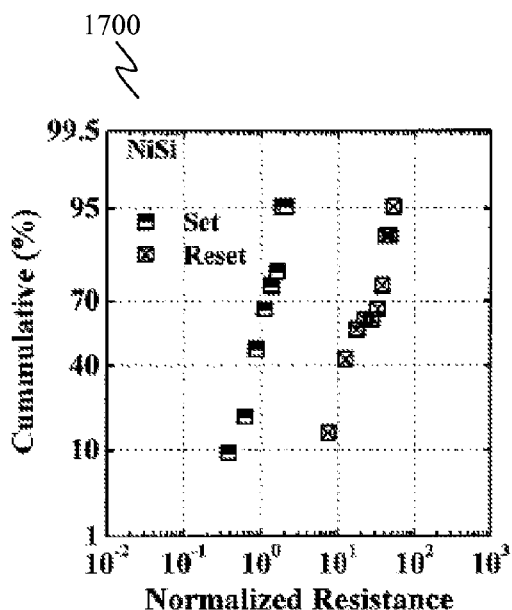
FIG. 17A shows a plot of cumulative SET and RESET resistance distribution for memory components with a NiSi bottom electrode, according to various embodiments.
Figure 17B:
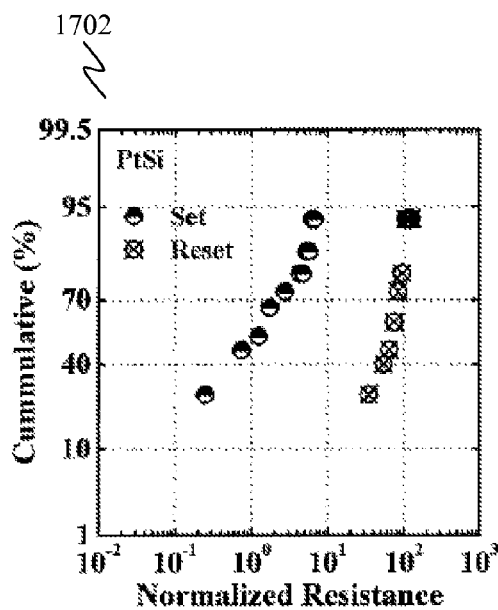
FIG. 17B shows a plot of cumulative SET and RESET resistance distribution for memory components with a PtSi bottom electrode, according to various embodiments.

FIG. 17A shows a plot 1700 of cumulative SET and RESET resistance distribution for memory components with a NiSi bottom electrode, according to various embodiments. FIG. 17B shows a plot 1702 of cumulative SET and RESET resistance distribution for memory components with a PtSi bottom electrode, according to various embodiments. The SET and RESET resistances shown in FIGS. 17A and 17B are normalized to the median SET resistance of each respective memory device.

As shown in FIGS. 17A and 17B, memory components with a PtSi bottom electrode show higher resistances than memory components with a NiSi bottom electrode. This may be attributed to the higher intrinsic resistivity of PtSi as compared to NiSi.

In addition, FIGS. 17A and 17B show that a RESET/SET resistance ratio of approximately 1 order of magnitude may be obtained. In other words, both memory components with a NiSi bottom electrode or a PtSi bottom electrode display a median resistance window of at least one order of magnitude. In various embodiments, the resistance ratio may be increased further via optimization of the device design. For example, a higher resistance ratio value may be obtained by manipulating or varying the silicide thickness and/or phase, using other silicide materials, or using other chalcogenide phase change materials.

Figure 17C:
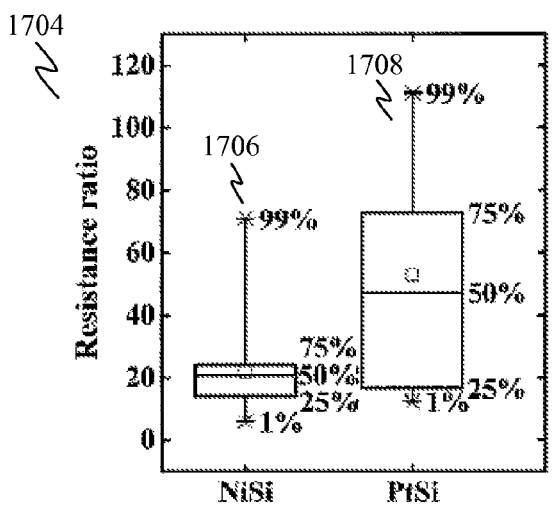
FIG. 17C shows a plot of statistical distributions of resistance ratio for memory components with silicided bottom electrodes, according to various embodiments.

FIG. 17C shows a plot 1704 of statistical distributions of resistance ratio for memory components with silicided bottom electrodes, according to various embodiments. Memory components with a NiSi bottom electrode, as shown by the box plot 1706, show a tighter resistance ratio distribution, while memory components with a PtSi bottom electrode, as shown by the box plot 1708, show a spread in the resistance ratio distribution. In addition, as shown in FIG. 17B and the box plot 1708 of FIG. 17C, a resistance ratio of two orders of magnitude may be achieved with memory components with a PtSi bottom electrode.

Figure 18:
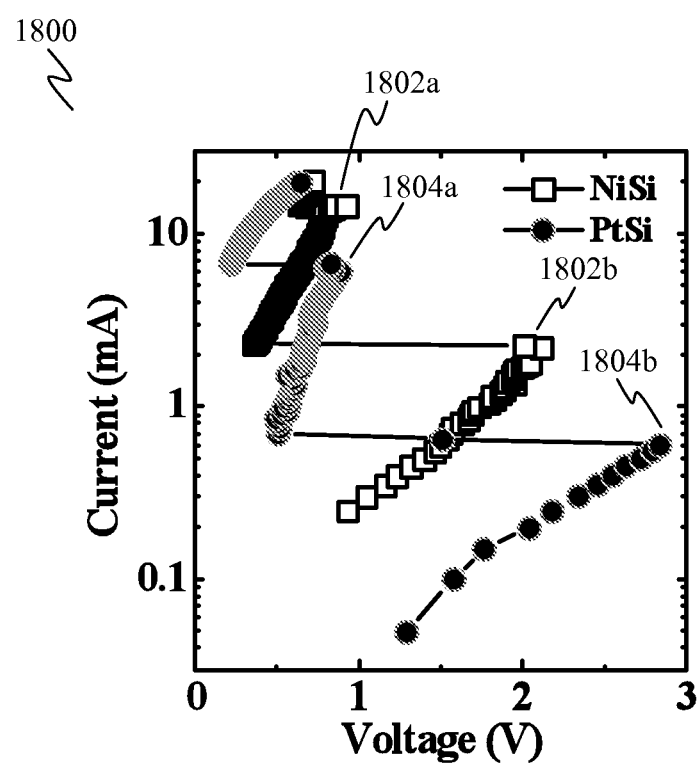
FIG. 18 shows a plot of direct current (DC) current-voltage (I-V) characteristics of memory components with silicided bottom electrodes, according to various embodiments.

FIG. 18 shows a plot 1800 of DC current-voltage (log-linear scale) characteristics of memory components with silicided bottom electrodes, according to various embodiments. The plot 1800, show the DC I-V sweeps of the memory components, illustrating the threshold switching characteristics of the memory components. As shown in FIG. 18, a lower threshold voltage is obtained for the memory component with a NiSi bottom electrode. In other words, the memory components with a NiSi bottom electrode switch at a lower threshold voltage, $V_{TH}$. The difference in the threshold voltages show that modifying the material bottom electrode may affect the threshold switching behaviour. In addition, memory components with a NiSi bottom electrode may allow higher current through the memory components than memory components with a PtSi bottom electrode. This may be attributed to the lower resistivity of NiSi as compared to PtSi.

In addition, multiple snap back events may be observed for both memory components with a NiSi bottom electrode or a PtSi bottom electrode, which may enable multi-state storage capability. As shown in FIG. 18, for the memory component with a NiSi bottom electrodes, snapback events as represented by 1802a, 1802b, may be observed, while for the memory component with a PtSi bottom electrodes, snapback events as represented by 1804a, 1804b, may be observed. In a snap back event, when the resistance of a device (e.g. a memory component) decreases at a fixed current, the voltage across the device is reduced, thereby enabling the device to operate at a lower voltage. In various embodiments, a snap back event may occur to reduce the voltage when the voltage is too high. In various embodiments, at the voltage when snap back occurs, the resistance of the device decreases, maintaining a lower voltage across the device and therefore, a lower current may be measured through the device.

Based on FIG. 18, both memory components exhibit the characteristic snap-back behaviour in the SET operation. Multiple switching events are also observed, which may allow multistate storage. The results in FIG. 18 shows two negative differential resistance regions with straight lines of different slopes, indicating three resistance states for possible multistate storage capability. A larger number of resistance states with a sufficient resistance window may enable a memory component or a memory cell to have a larger memory capability.

Figure 19:
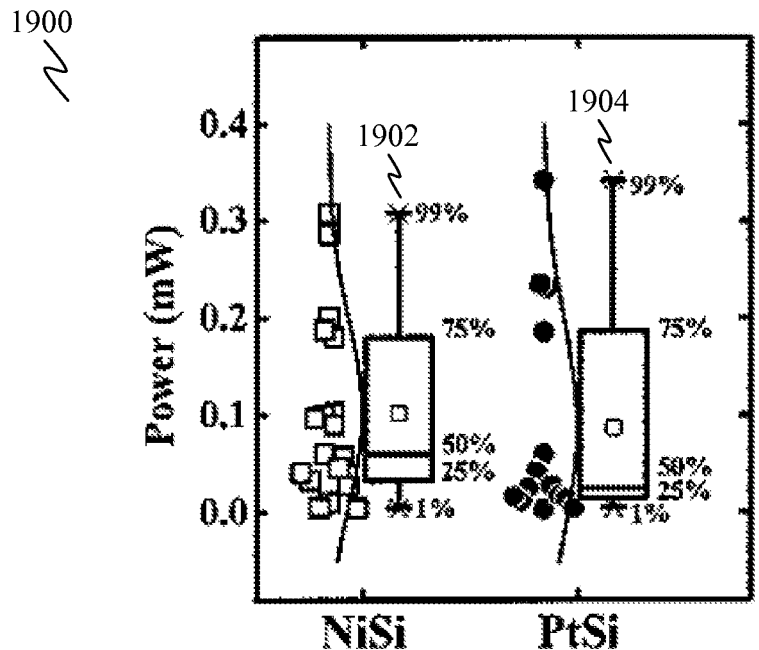
FIG. 19 shows a plot of statistical distributions of power distribution during threshold switching for memory components with silicided bottom electrodes, according to various embodiments.

FIG. 19 shows a plot 1900 of statistical distributions of power distribution during threshold switching for memory components with silicided bottom electrodes, according to various embodiments. As shown in FIG. 19, the memory components with NiSi bottom electrode (the results as represented by the box plot 1902) has a higher mean power of about $1.2 \times 10^{-4}$ W (e.g. about 0.1 mW) compared to the memory components with a PtSi bottom electrode (the results as represented by the box plot 1904), with a mean power of about $8.7 \times 10^{-5}$ W (e.g. about 0.09 mW). As threshold switching necessitates a constant power requirement, the high current through the memory components with a NiSi bottom electrode or a PtSi bottom electrode generates sufficient joule heating within the phase change layer for the snap-back event to take place. This occurs at lower voltages for devices with a NiSi bottom electrode.

Figure 20:
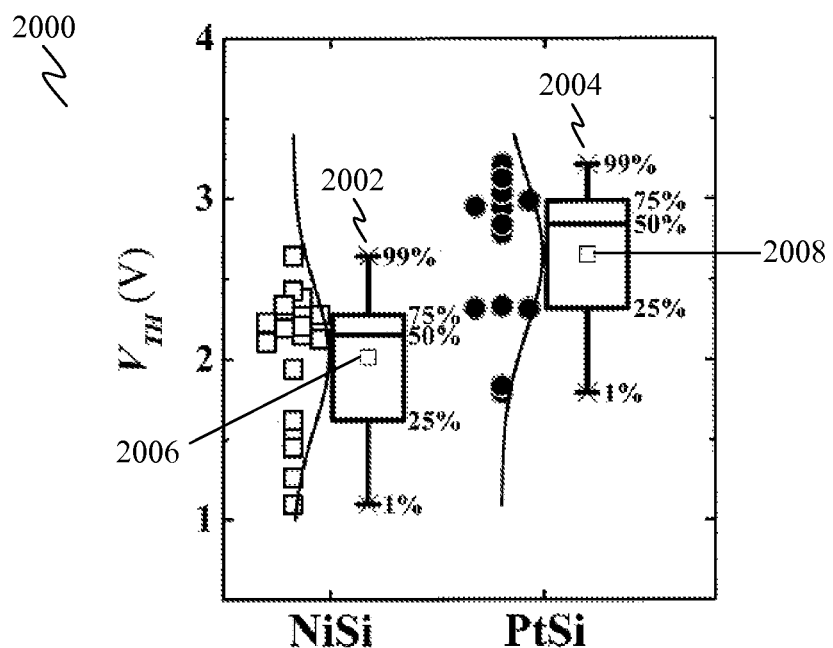
FIG. 20 shows a plot of statistical distributions of threshold switching voltage for memory components with silicided bottom electrodes, according to various embodiments.

FIG. 20 shows a plot 2000 of statistical distributions of threshold switching voltage for memory components with silicided bottom electrodes, according to various embodiments, obtained from DC current-voltage (I-V) characteristics. As shown in FIG. 20, the memory components with a NiSi bottom electrode requires a lower threshold voltage. As shown by the box plot 2002, the memory components with a NiSi bottom electrode exhibit a mean voltage threshold, $V_{TH}$, of about 2.15 V (corresponding to the box 2006), while as shown by the box plot 2004, the memory components with a PtSi bottom electrode exhibit a mean voltage threshold, $V_{TH}$, of about 2.76 V (corresponding to the box 2008).

The results of various embodiments show that silicides (e.g. nickel monosilicide or platinum monosilicide) may be used as an effective heater and a good metal contact (e.g. as a bottom electrode) in memory components and cells (e.g. for phase change memory). In addition, the memory components with silicided bottom electrode show non-volatile memory behaviour. Therefore, memory components with metal silicides as the bottom electrode may be provided or fabricated, thereby enabling compact integration of memory components with CMOS devices. In addition, various embodiments enable the integration of memory components directly on the silicided drain regions of metal-oxide-semiconductor field-effect-transistors (MOSFETs), facilitating compact integration with reduced process complexity and cost.

It should be appreciated that memory cells including an access device (e.g. a transistor) and a memory component of various embodiments may be provided. In addition, a memory device including one or more memory cells of various embodiments may be provided. Furthermore, it should be appreciated that the results shown for the memory components of various embodiments may be equally applied to memory cells and memory devices having the memory components of various embodiments.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A memory component, comprising:
   a storage component comprising a resistance changing material;
   an electrical contact coupled to the storage component, wherein the electrical contact comprises silicide; and
   a dielectric layer disposed within the storage component;
   wherein the memory component is free of a metal layer between the storage component and the electrical contact, and
   wherein the electrical contact is free of a metal layer.

2. The memory component as claimed in claim 1, further comprising a further dielectric layer disposed on at least one side of the storage component.

3. The memory component as claimed in claim 1, wherein the resistance changing material comprises a phase change material.

4. The memory component as claimed in claim 3, wherein the phase change material comprises a chalcogenide or an alloy of chalcogenides.

5. The memory component as claimed in claim 3, wherein the phase change material further comprises a dopant.

6. A method of forming a memory component, the method comprising:
   forming an electrical contact, the electrical contact comprising silicide and is free of a metal layer;
   depositing a storage component over the electrical contact, the storage component comprising a resistance changing material; and
   forming a dielectric layer within the storage component;
   wherein the method is free of forming a metal layer between the storage component and the electrical contact.

7. A memory component, comprising:
   a storage component comprising a resistance changing material; and
   an electrical contact coupled to the storage component, wherein the electrical contact comprises silicide, and
   wherein the memory component is free of a metal layer between the storage component and the electrical contact,
   wherein the electrical contact is free of a metal layer, and
   wherein the memory component further comprises a dielectric layer disposed over a portion of the electrical contact, wherein the portion overlaps with the entire storage component.

8. The memory component as claimed in claim 7, wherein the dielectric layer is disposed within the storage component or in between the storage component and the electrical contact.

* * * * *